(12) United States Patent
Mackin et al.

(10) Patent No.: US 9,925,611 B2
(45) Date of Patent: Mar. 27, 2018

(54) ELECTRICAL COMPONENT HAVING PRESOLDERED SURFACE WITH FLUX RESERVOIRS

(71) Applicant: ANTAYA TECHNOLOGIES CORP., Cranston, RI (US)

(72) Inventors: Alexandra Mary Mackin, West Warwick, RI (US); John Pereira, Cranston, RI (US); Matthew J. Scherer, Kingston, RI (US)

(73) Assignee: ANTAYA TECHNOLOGIES CORPORATION, Warwick, RI (US)

( * ) Notice: Subject to any disclaimer, the term of this patent is extended or adjusted under 35 U.S.C. 154(b) by 188 days.

(21) Appl. No.: 14/339,628

(22) Filed: Jul. 24, 2014

(65) Prior Publication Data

US 2015/0034704 A1 Feb. 5, 2015

Related U.S. Application Data

(60) Provisional application No. 61/860,487, filed on Jul. 31, 2013.

(51) Int. Cl.
*B23K 1/20* (2006.01)
*H05K 3/34* (2006.01)
(Continued)

(52) U.S. Cl.
CPC ............ *B23K 1/203* (2013.01); *H01B 5/002* (2013.01); *H05K 3/3489* (2013.01);
(Continued)

(58) Field of Classification Search
USPC ........................................................ 228/56.3
See application file for complete search history.

(56) References Cited

U.S. PATENT DOCUMENTS 1,785,778 A    12/1930    Krembs
3,239,125 A *   3/1966    Hugh ................. H01R 4/723
                                                            174/84 R (Continued)

FOREIGN PATENT DOCUMENTS

CA          562 812          9/1958
CN       103022321 A      4/2013
(Continued)

OTHER PUBLICATIONS

International Search Report and Written Opinion for PCT/US2014/047981 dated Feb. 26, 2015, entitled "Electrical Component Having Presoldered Surface With Flux Reservoirs".

*Primary Examiner* — Devang R Patel
(74) *Attorney, Agent, or Firm* — Robert J. Myers

(57) ABSTRACT

A presoldered prefluxed electrical component or connector, which can protect the flux from wearing off the surface of solder during shipping and handling. The electrical component can include a terminal pad. A layer of solder can be on the terminal pad. The layer of solder can have a surface with a series of generally equally spaced apart flux wells formed in the surface of the solder for protectively storing and retaining flux therein. The flux wells can have a lateral dimension of at least 0.05 mm and a depth of at least 0.023 mm that is deep enough for retaining a quantity of flux therein when flux on the surface of the layer of solder wears off during shipping and/or handling.

18 Claims, 20 Drawing Sheets

(51) Int. Cl.
*B23K 35/00* (2006.01)
*H01B 5/00* (2006.01)
*H05K 13/04* (2006.01)
*B23K 35/22* (2006.01)

(52) U.S. Cl.
CPC .......... *H05K 13/0465* (2013.01); *B23K 35/22* (2013.01); *H05K 2201/09745* (2013.01)

(56) References Cited

U.S. PATENT DOCUMENTS

| | | | | |
|---|---|---|---|---|
| 3,324,230 | A | * | 6/1967 | Hugh .................... H01R 4/723 174/84 R |
| 3,388,850 | A | * | 6/1968 | Laubmeyer ........ B23K 35/0227 228/56.3 |
| 3,818,489 | A | | 6/1974 | Bobel, II et al. |
| 4,774,760 | A | * | 10/1988 | Seaman ............... H05K 3/3421 228/246 |
| 5,143,273 | A | * | 9/1992 | Topel ..................... B23K 1/20 174/126.1 |
| 5,213,828 | A | | 5/1993 | Winter et al. |
| 5,478,700 | A | | 12/1995 | Gaynes et al. |
| 5,482,736 | A | | 1/1996 | Glenn et al. |
| 5,626,278 | A | * | 5/1997 | Tang .................... B23K 3/0607 228/246 |
| 6,042,932 | A | | 3/2000 | Ingles et al. |
| 6,253,988 | B1 | * | 7/2001 | Pereira .................. B23K 35/26 228/122.1 |
| 6,316,736 | B1 | | 11/2001 | Jairazbhoy et al. |
| 7,261,760 | B2 | * | 8/2007 | Ishida .................... B22F 9/082 148/432 |
| 2009/0229861 | A1 | | 9/2009 | Hando et al. |
| 2012/0222893 | A1 | * | 9/2012 | Hwang .................. B23K 35/24 174/257 |
| 2014/0158424 | A1 | * | 6/2014 | Schlarb ................ B23K 1/0008 174/94 R |

FOREIGN PATENT DOCUMENTS

| | | | |
|---|---|---|---|
| CN | 103025479 A | 4/2013 | |
| CN | 103203608 A | 7/2013 | |
| EP | 0 245 677 | 11/1987 | |
| GB | 692710 A | * 6/1953 | ......... B23K 35/0222 |
| GB | 2 047 150 | 11/1980 | |
| JP | 2001-53431 | 2/2001 | |
| JP | 2008-205446 | 9/2008 | |
| TW | 201212760 A | 1/2011 | |
| WO | 2012136733 A1 | 10/2012 | |
| WO | 2013004434 A1 | 1/2013 | |

\* cited by examiner regular solder flat surface evidence of flux flaking flat solder surface wiped off

AREA: 20.25 MM^2

AREA: 16.25 MM^2

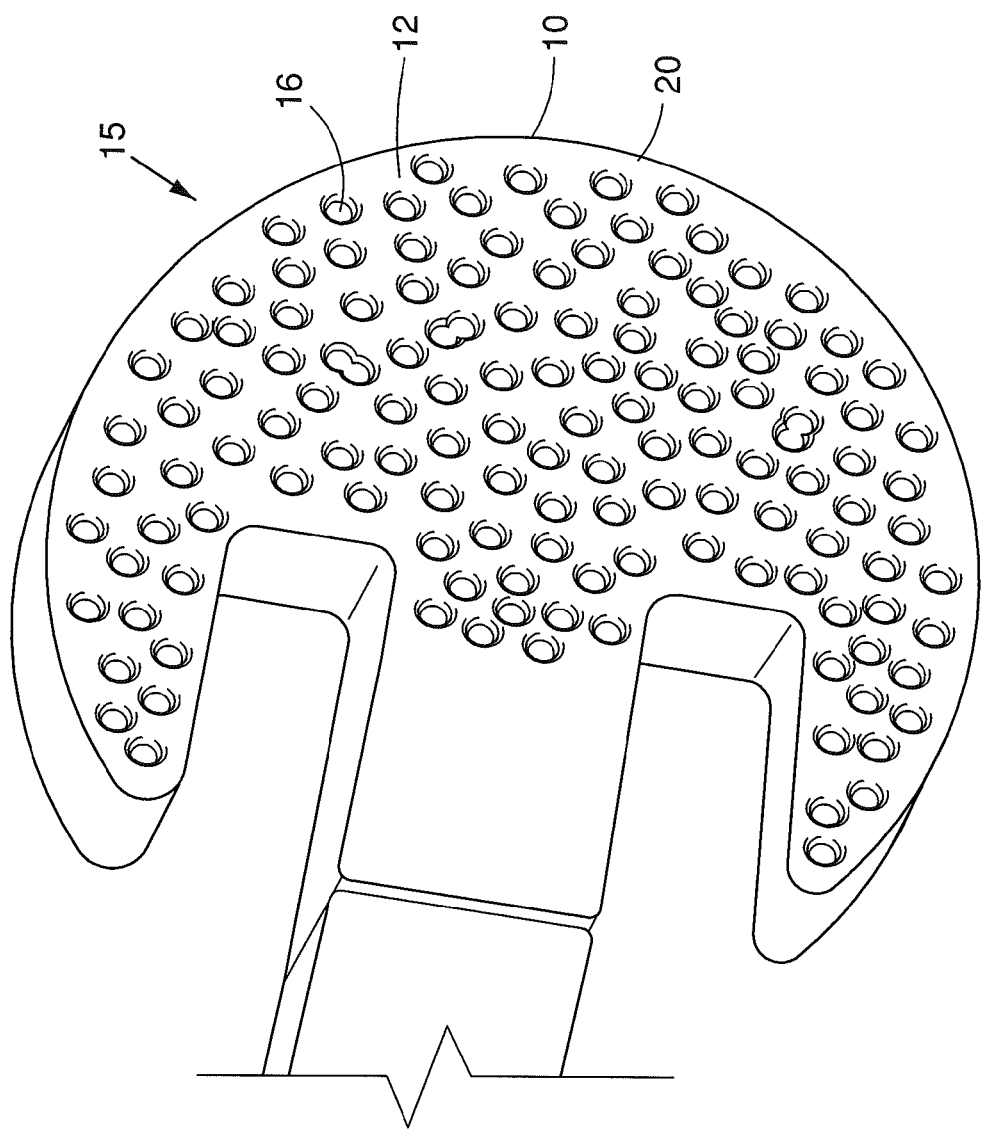
FIG. 5  edm surface

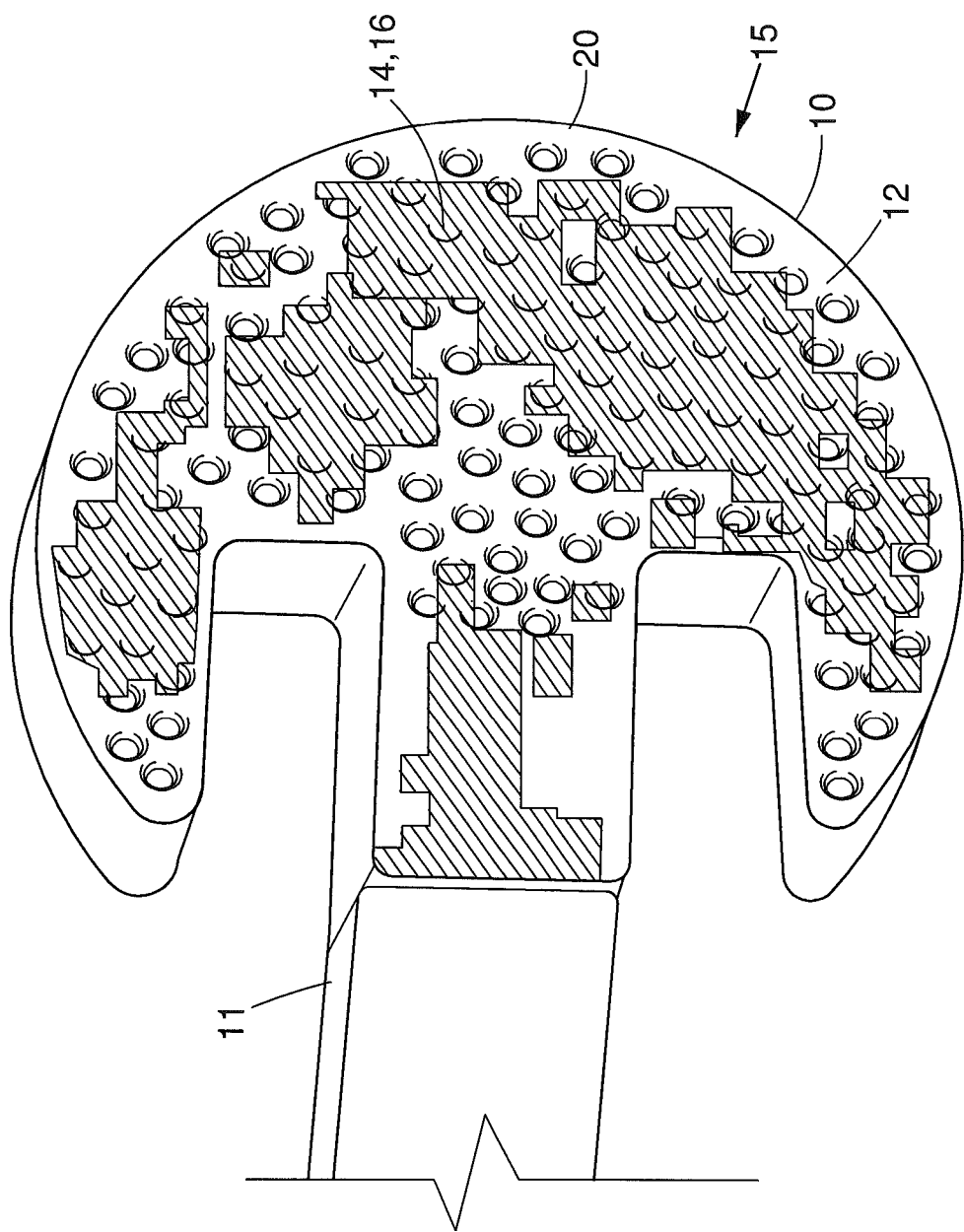
FIG. 6  edm surface after shipping 3 times

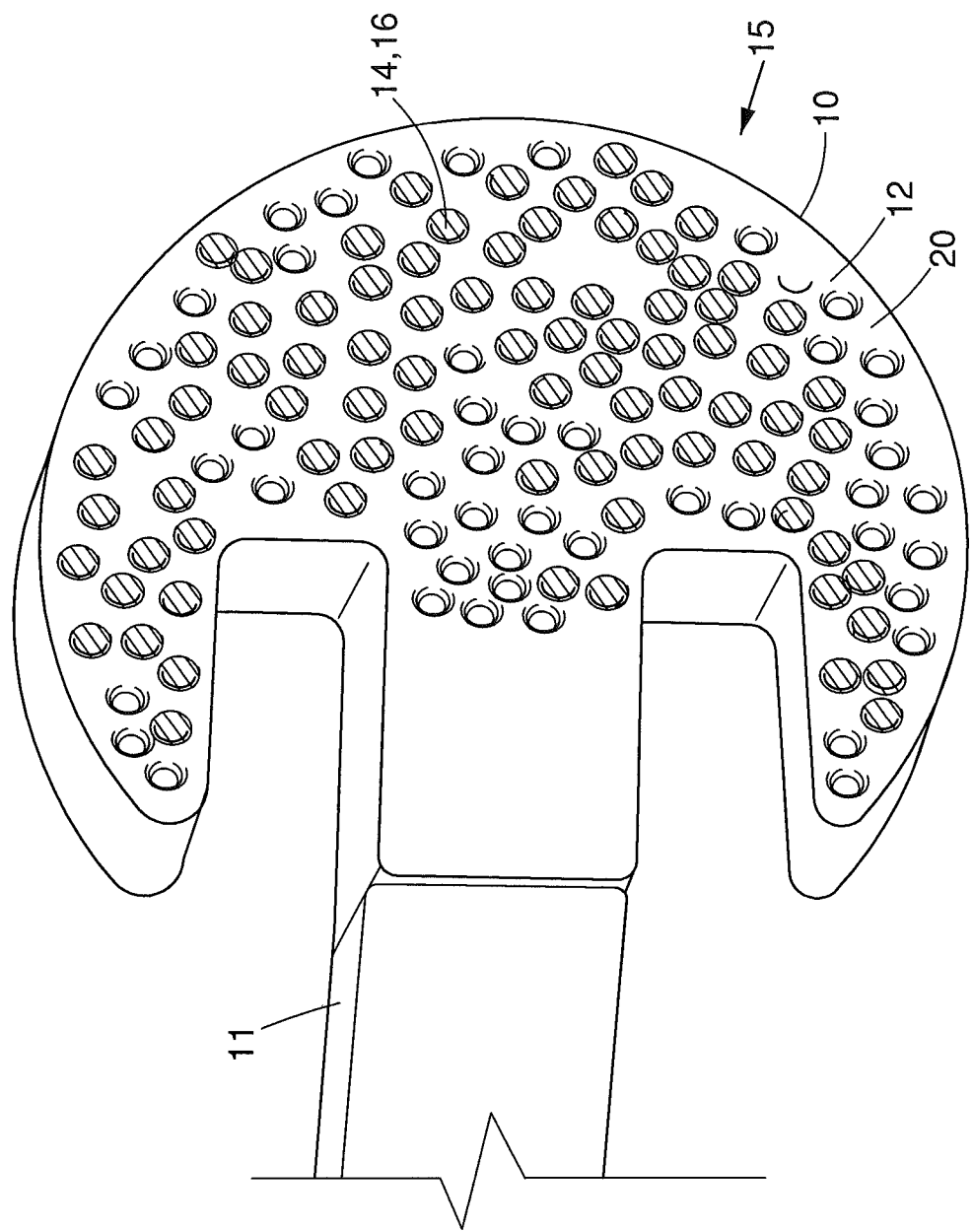
FIG. 7 edm surface after wipe off

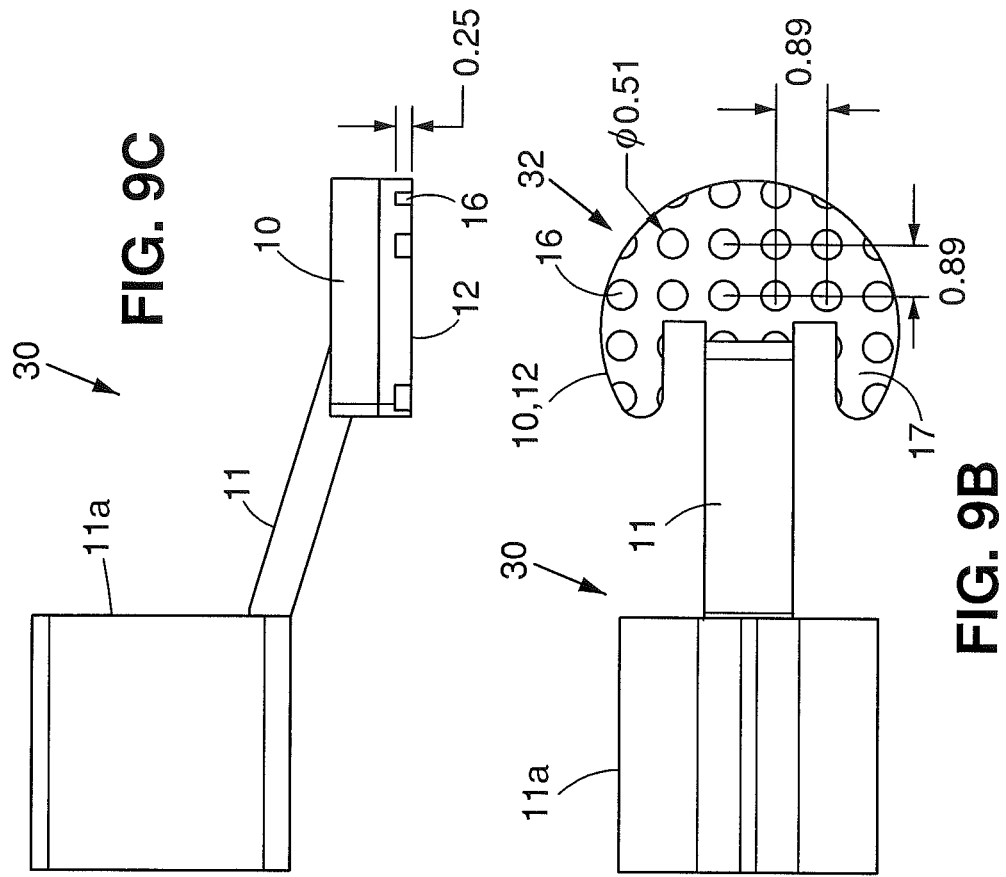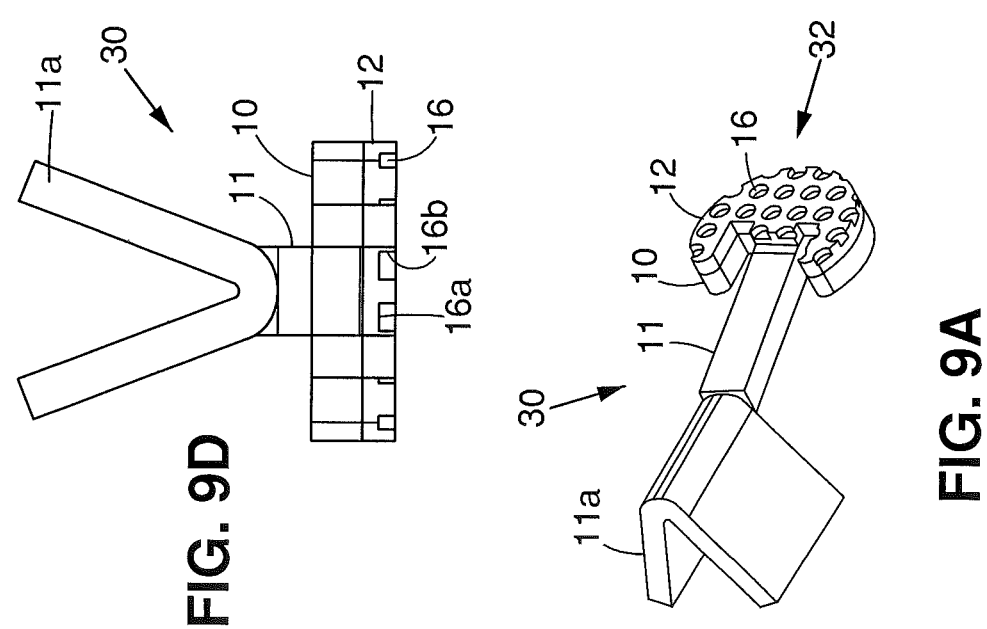

FIG. 11 .25 deep pits

.25 surface after shipping 3 times

.25 deep pits after wipe off

BASE CONTROL SAMPLE, 5 MICRON PITS

EDM FINISH 23 MICRON PITS

HASHMARK 150 MICRON PITS

CIRCULAR 250 MICRON PITS

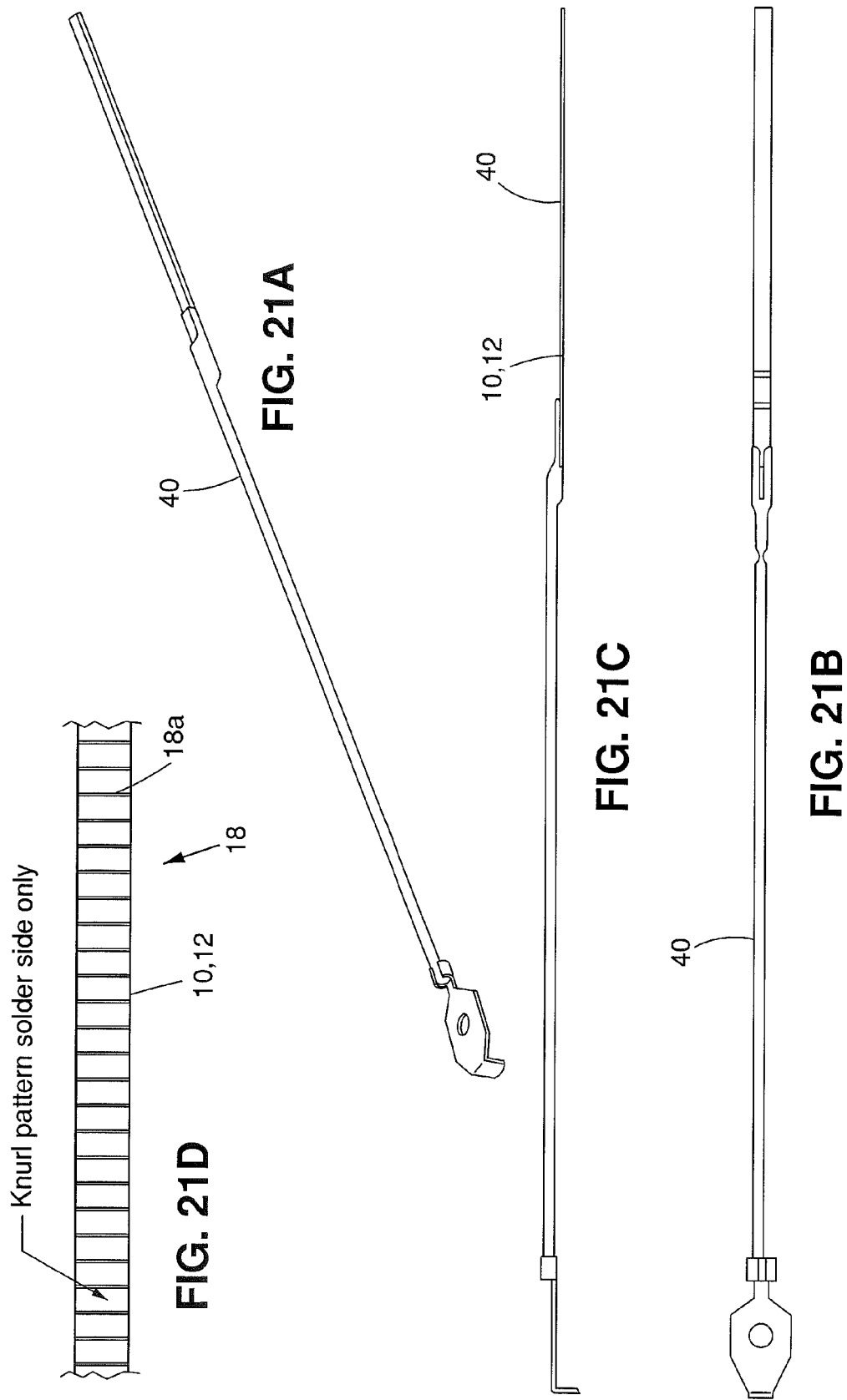

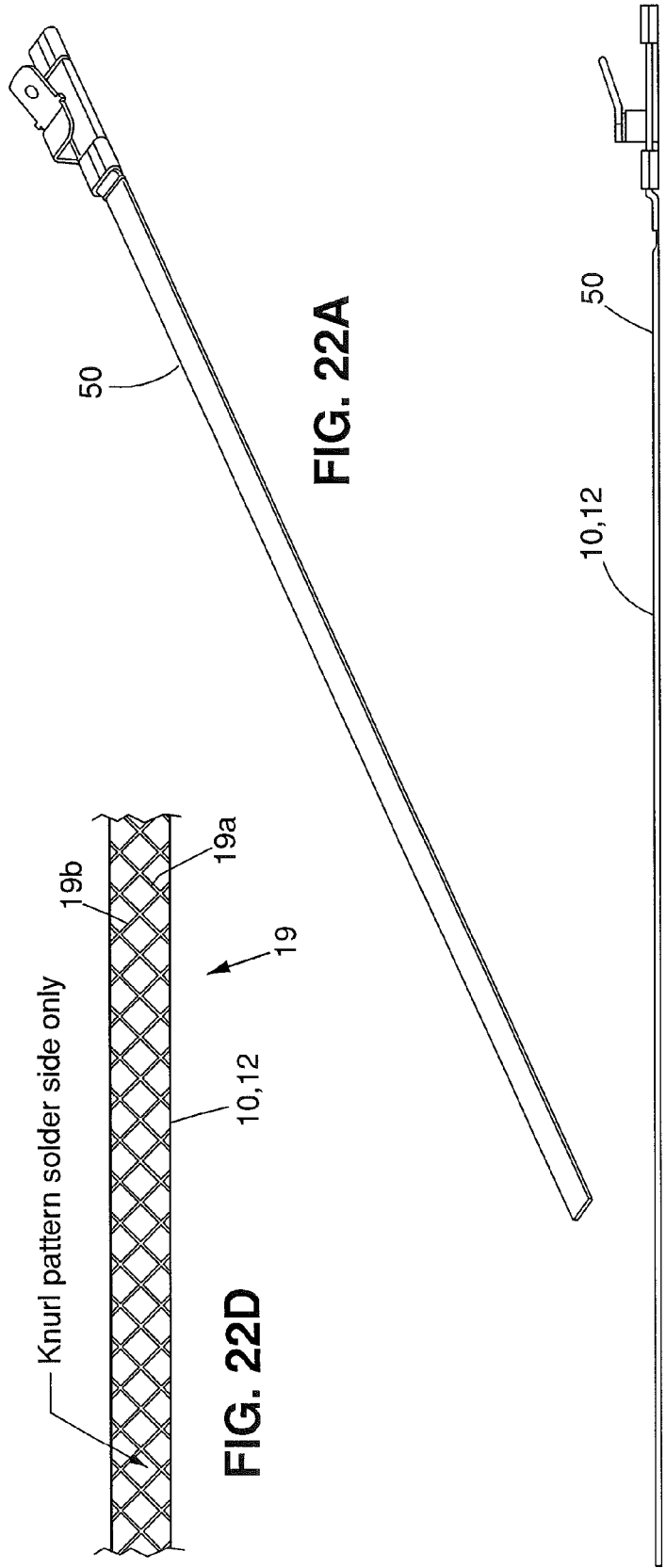

ELECTRICAL COMPONENT HAVING PRESOLDERED SURFACE WITH FLUX RESERVOIRS

RELATED APPLICATION

This application claims the benefit of U.S. Provisional Application No. 61/860,487, filed on Jul. 31, 2013. The entire teachings of the above application are incorporated herein by reference.

BACKGROUND

Referring to FIG. 1, in the prior art, an electrical component 8 such as an electrical connector can have a terminal pad 10 with a presoldered solder layer 12 that is generally flat. A layer of flux 14 such as a rosin based flux that dries and/or hardens can be applied to the solder layer 12 (FIG. 2). During shipping and handling, the electrical components can rub against each other, such as with vibration, and this layer of flux 14 can flake and chip or wear off, which can adversely affect the soldering process and provide an inferior or weaker soldered joint. FIG. 3 depicts the flux layer 14 almost completely wiped from the solder layer 12, after wiping by hand, to illustrate how much flux can potentially flake off.

SUMMARY

The present invention can provide an electrical device, component or connector, which can protect flux from rubbing, wearing, scraping, crumbling, flaking or chipping off the surface of solder, or otherwise removed. The electrical component can include a terminal pad. A layer of solder can be on the terminal pad. The layer of solder can have a surface with a series of generally equally spaced apart flux reservoirs, pits, cavities or wells formed in the surface of the solder for protectively storing and retaining flux therein. The flux wells can have a lateral dimension of at least 0.05 mm and a depth of at least 0.023 mm that is deep enough for retaining a quantity of flux therein when flux on the surface of the layer of solder wears off during shipping and/or handling.

In particular embodiments, the flux wells can be configured for retaining quantities of flux therein within the layer of solder in a generally even lateral spaced apart distribution in x and y directions across the layer of solder. The flux wells can have a diameter of at least 0.05 mm, a depth of at least 0.023 mm, and can be in a continuous pattern with at least 0.035 mm spacing in the x and y directions. In one embodiment, the flux wells can have a diameter of about 0.51 mm, a depth of about 0.25 mm, and can be in a continuous pattern with about 0.89 mm spacing in the x and y directions. In another embodiment, the flux wells can be interconnected and formed by a grid of criss crossing grooves in x and y directions about 0.15 mm wide, about 0.15 mm deep, and separated from each other by about 0.25 mm. The electrical component can include a connector portion extending from the terminal pad for connection to a desired element. A layer of flux can be on at least a portion of the layer of solder and fill at least a portion of the flux wells. The layer of solder can be formed of a lead free solder composition, and the flux can be a type suitable for lead free solder compositions.

The present invention can also provide an electrical device, component or connector having a terminal pad, and a layer of solder on the terminal pad. The layer of solder can have a surface with a series of generally equally spaced apart flux wells formed in the surface of the solder for protectively storing and retaining flux therein. The flux wells can have a lateral dimension of at least 0.05 mm.

In particular embodiments, the flux wells can have a diameter of at least 0.05 mm, and can be in a continuous pattern with at least 0.035 mm spacing in x and y directions.

The present invention can also provide an electrical device, component or connector, having a terminal pad, and a layer of solder on the terminal pad. The layer of solder can have a surface with a knurled pattern formed in the surface of the solder for protectively storing and retaining flux therein.

In particular embodiments, the knurled pattern can have a first series of generally equally spaced apart elongate indentations. In another embodiment, the knurled pattern can further include a second series of generally equally spaced apart elongate indentations which cross the first series of indentations at an angle.

The present invention can also provide an electrical device, component or connector, having a terminal pad, and a layer of solder on the terminal pad. The layer of solder can have a surface with a pattern of generally equally spaced apart flux reservoirs formed in the surface of the solder for protectively storing and retaining flux therein.

The present invention can also provide a method of protecting flux on a presoldered prefluxed electrical device, component or connector. The electrical component can be provided with a terminal pad. A layer of solder can be provided on the terminal pad. The layer of solder can have a surface. A layer of flux can be provided on the layer of solder. At least portions of the flux can fill a series of generally equally spaced apart flux wells formed in the surface of the solder which protectively store and retain flux therein from wear during shipping and/or handling. The flux wells can have a lateral dimension of at least 0.05 mm and a depth of at least 0.023 mm that is deep enough for retaining a quantity of flux therein when flux on the surface of the layer of solder wears off during shipping and/or handling.

In particular embodiments, the flux wells can be configured for retaining quantities of flux therein within the layer of solder in a generally even lateral spaced apart distribution in x and y directions across the solder. The flux wells can be provided with a diameter of at least 0.05 mm, a depth of at least 0.023 mm, and a continuous pattern with at least 0.035 mm spacing in x and y directions. In one embodiment, the flux wells can be provided with a diameter of about 0.51 mm, a depth of about 0.25 mm, and a continuous pattern with about 0.89 mm spacing in the x and y directions. In another embodiment, interconnected flux wells can be provided by a grid of criss crossing grooves in x and y directions about 0.15 mm wide, about 0.15 mm deep, and separated from each other by about 0.25 mm. The electrical component can be provided with a connector portion extending from the terminal pad for connecting to a desired element. The layer of solder can be provided as a lead free solder composition and the flux can be a type suitable for lead free solder compositions.

The present invention can also provide a method of protecting flux on a presoldered prefluxed electrical device, component or connector including providing the electrical component with a terminal pad. A layer of solder can be provided on the terminal pad. The layer of solder can have a surface. A layer of flux can be provided on the layer of solder. At least portions of the flux can fill a series of generally equally spaced apart flux wells formed in the surface of the solder which protectively store and retain flux therein from wear during shipping. The flux wells can have a lateral dimension of at least 0.05 mm.

In particular embodiments, the flux wells can be provided with a diameter of at least 0.05 mm, and can be in a continuous pattern with at least 0.35 mm spacing in x and y directions.

The present invention can also provide a method of protecting flux on a presoldered prefluxed electrical device, component or connector including providing the electrical component with a terminal pad. A layer of solder can be provided on the terminal pad. The layer of solder can have a surface. A layer of flux can be provided on the layer of the solder. At least portions of the flux can fill a knurled pattern formed in the surface of the solder which protectively stores and retains flux therein from wear during shipping.

In particular embodiments, the knurled pattern can be provided with a first series of generally equally spaced apart elongate indentations. In another embodiment, a second series of generally equally spaced apart elongate indentations can cross the first series at an angle.

The present invention can also provide a method of protecting flux on a presoldered prefluxed electrical device, component or connector including providing the electrical component with a terminal pad. A layer of solder can be provided on the terminal pad. The layer of solder can have a surface. A layer of flux can be provided on the layer of solder. At least portions of the flux can fill a pattern of generally equally spaced apart flux reservoirs formed in the surface of the solder which protectively store and retain flux therein from wear during shipping.

The present invention can also provide a method of soldering a presoldered prefluxed electrical device, component or connector to a substrate. The electrical component can have a terminal pad with a layer of solder on the terminal pad. The layer of solder can have a surface. A layer of flux can be on the layer of solder. A series of generally equally spaced apart flux wells formed in the surface of the solder protectively store and retain flux therein from wear during shipping and/or handling. The flux wells can have a lateral dimension of at least 0.05 mm and a depth of at least 0.023 mm. The presoldered prefluxed terminal pad can be contacted to the substrate and heat applied. The series of generally equally spaced apart flux wells can supply flux for the soldering operation while spacing a generally even distribution of portions of the solder layer away from heat sink contact with the substrate, providing for even heating and melting of the solder.

In particular embodiments, the flux wells can be provided with a diameter of at least 0.05 mm, a depth of at least 0.023 mm, and a continuous pattern with at least 0.035 mm spacing in x and y directions. In one embodiment, the flux wells can be provided with a diameter of about 0.51 mm, a depth of about 0.25 mm, and a continuous pattern with about 0.89 mm spacing in the x and y directions. In another embodiment, interconnected flux wells can be provided by a grid of criss crossing grooves in x and y directions about 0.15 mm wide, about 0.15 mm deep, and separated from each other by about 0.25 mm.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 5-7 are drawings of the terminal pad of FIG. 4 having an edm surface (FIG. 5), having a layer of flux that has been subjected to being shipped 3 times (FIG. 6), and having the flux wiped off (FIG. 7).

FIGS. 9A-9D and 10 are drawings of another embodiment of an electrical component having a terminal pad in the present invention with 0.51 mm dia×0.25 mm deep, flux wells, cavities or reservoirs, showing a rear bottom perspective view (FIG. 9A), a bottom view (FIG. 9B), a side view (FIG. 9C), an end view (FIG. 9D), and a bottom perspective view (FIG. 10).

FIGS. 21A-21D are drawings of another electrical component including a terminal pad having a layer of solder with flux reservoirs, canals or trenches formed by a knurled surface, which consists of a series of equally spaced apart elongate indentations, with FIG. 21A being a perspective view, FIG. 21B being a bottom view, FIG. 21C being a side view, and FIG. 21D being a plan view of the knurled pattern.

FIGS. 22A-22D are drawings of another electrical component including a terminal pad having a layer of solder with flux reservoirs, canals or trenches formed by a knurled surface, which consists of first and second series of equally spaced apart elongate indentations which cross each other at an angle, with FIG. 22A being a perspective view, FIG. 22B being a bottom view, FIG. 22C being a side view, and FIG. 22D being a plan view of the knurled pattern.

DETAILED DESCRIPTION

A description of example embodiments of the invention follows.

Figure 1:
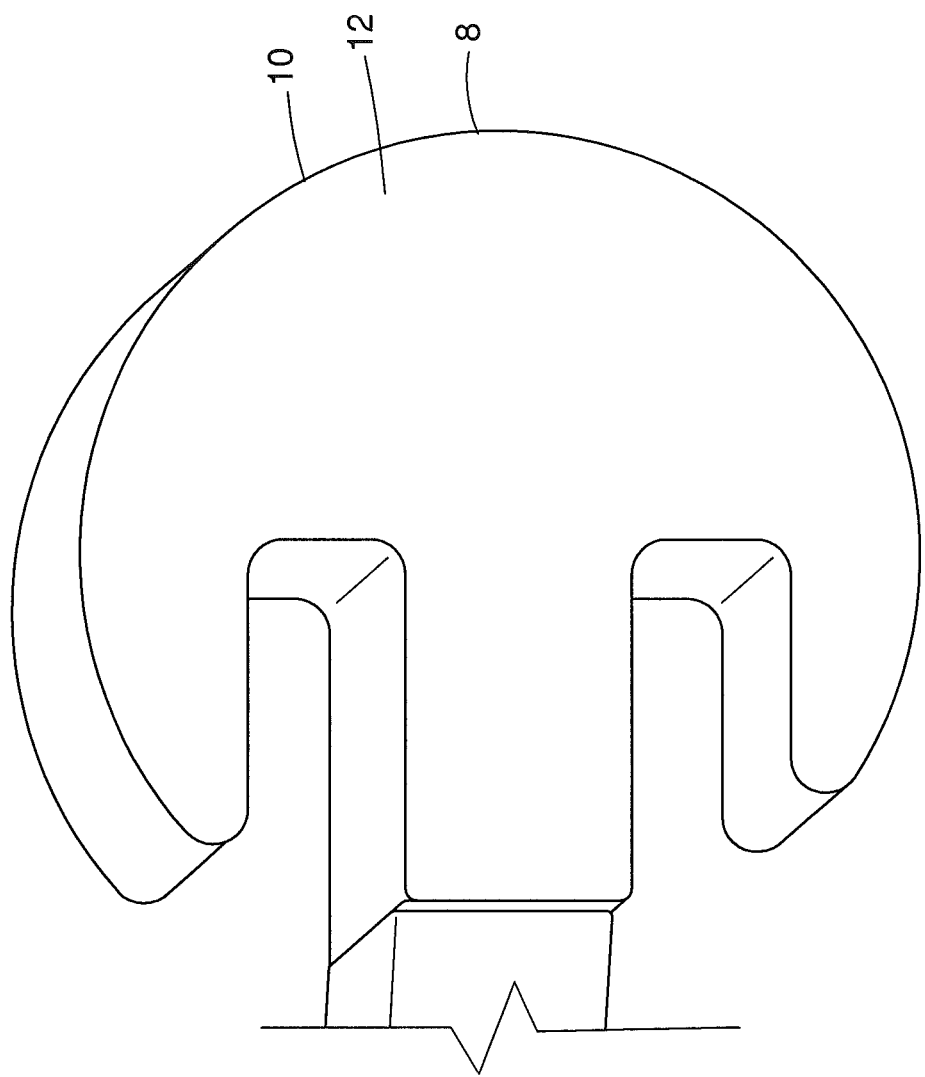
FIGS. 1-3 are drawings depicting a terminal pad of a prior art electrical component having a flat layer of solder (FIG. 1), having a layer of flaking flux on the solder (FIG. 2), and having the flux wiped off (FIG. 3).
Figure 2:
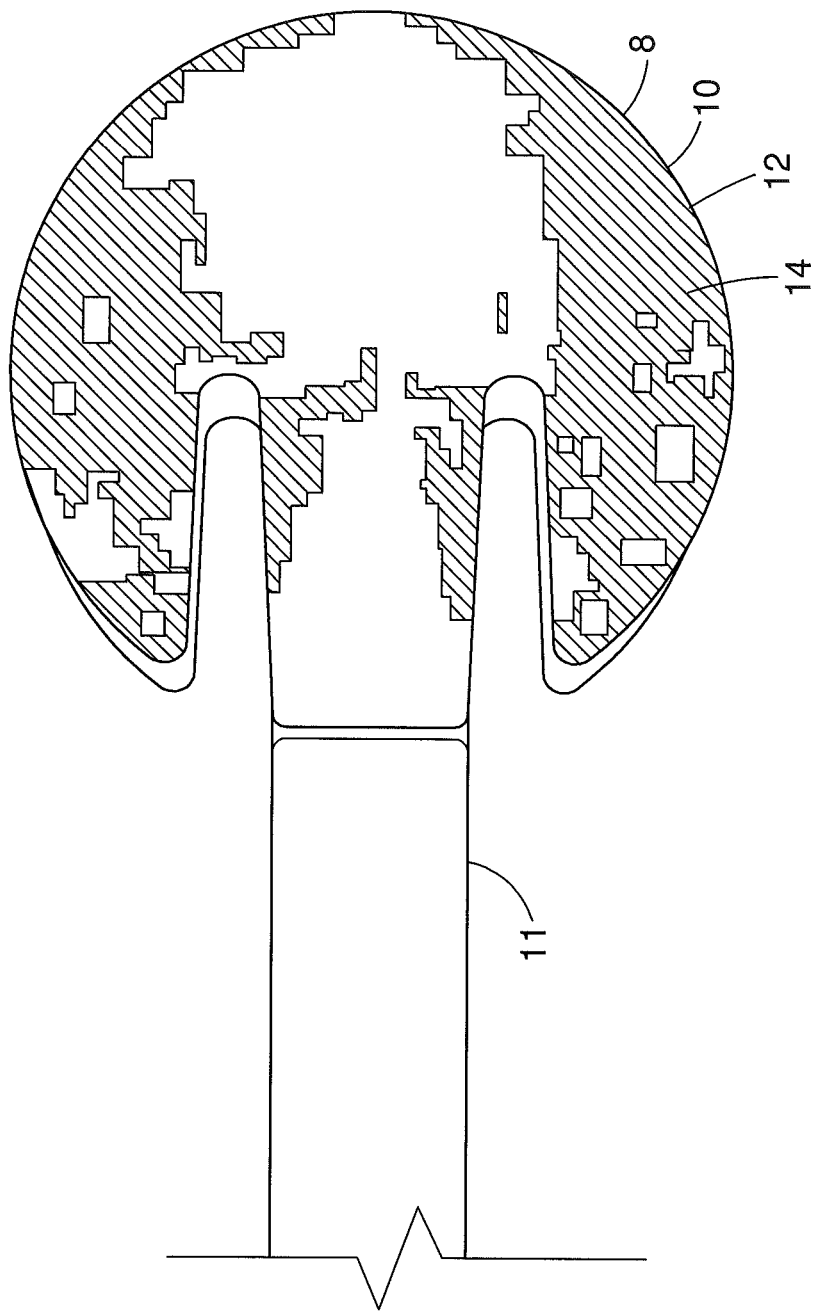
Figure 3:
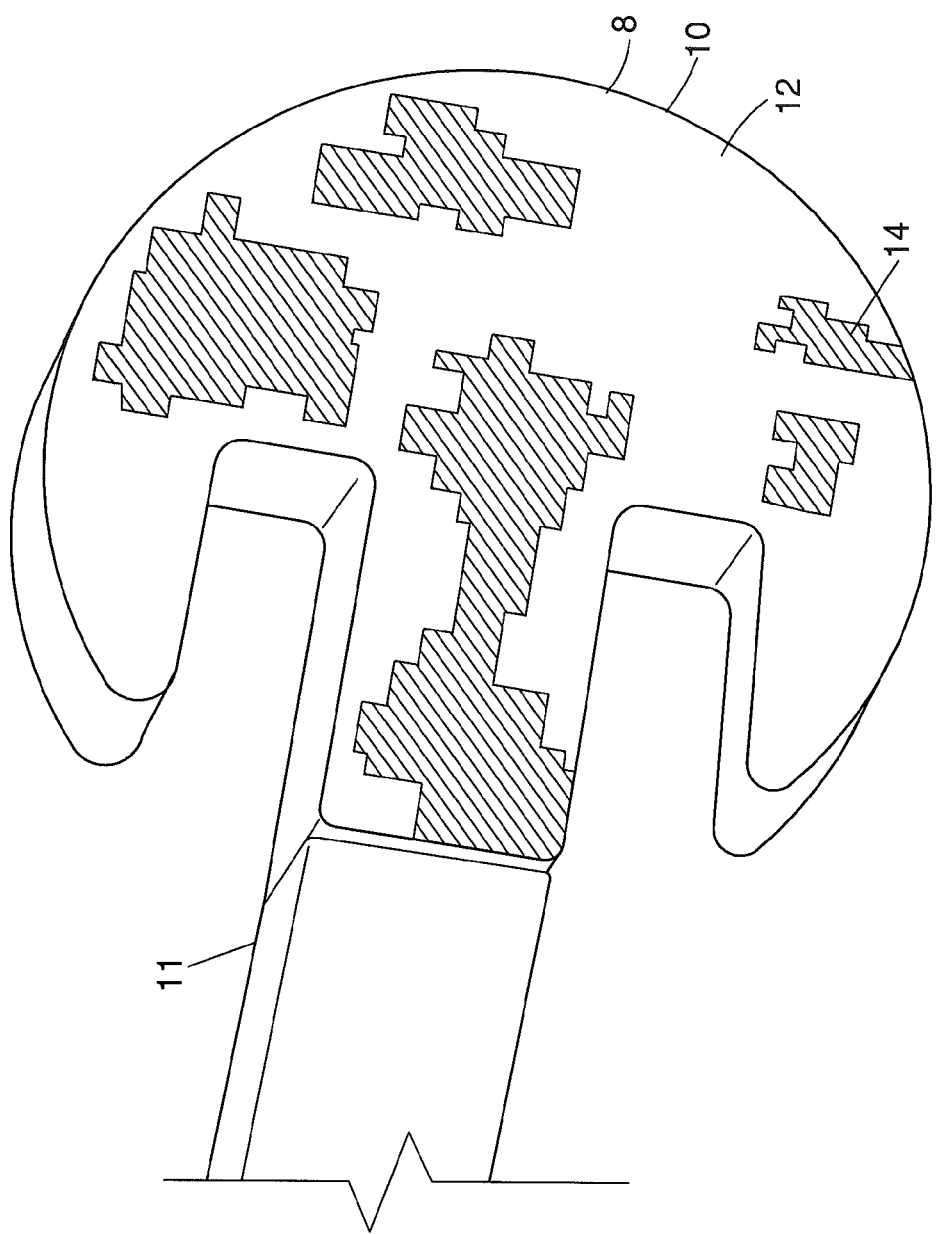
Figure 4C:
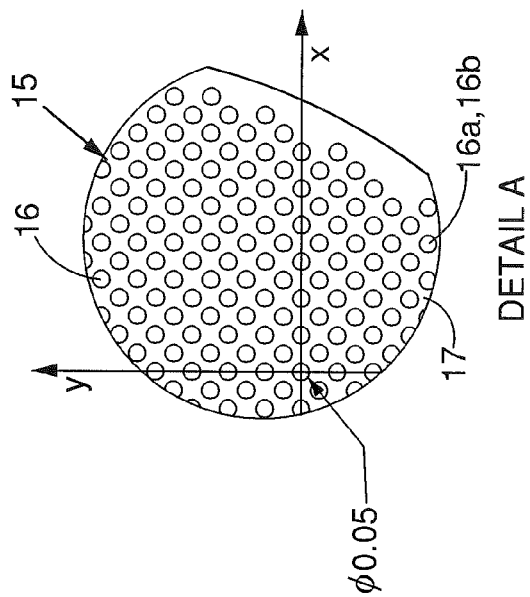
FIGS. 4A-4C are drawings depicting a terminal pad of an electrical component in the present invention showing a flat surface area (FIG. 4A), showing a series of dimples forming flux wells, reservoirs or cavities in the layer of solder formed by an edm process (FIG. 4B), and an enlargement thereof (FIG. 4C).
Figure 4B:
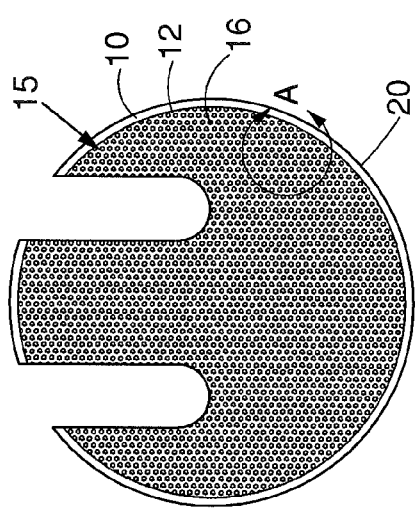
Figure 4A:
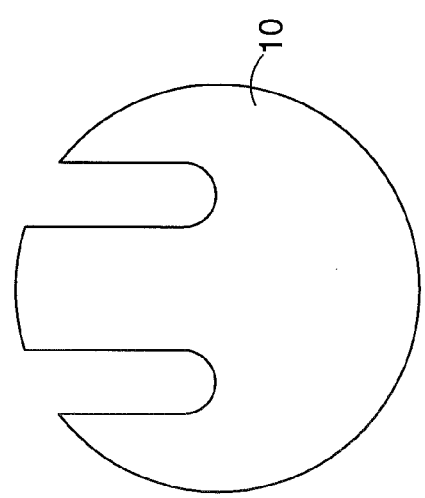
Figure 8:
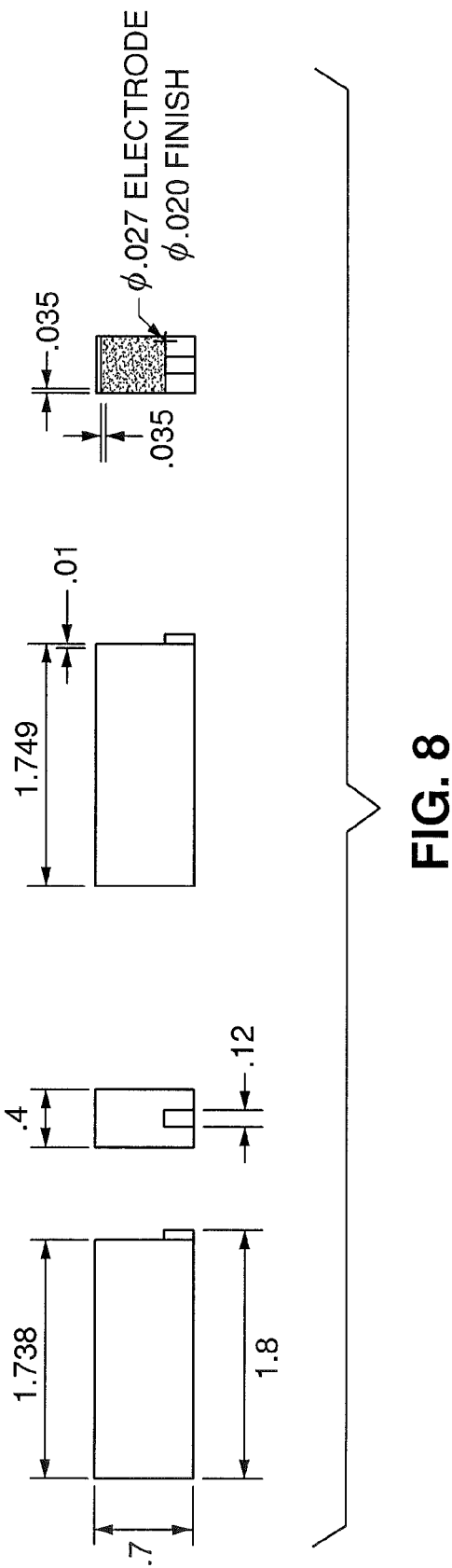
FIG. 8 is an engineering drawing of embodiments of an edm electrode for forming flux wells, showing various views and dimensions.
Figure 10:
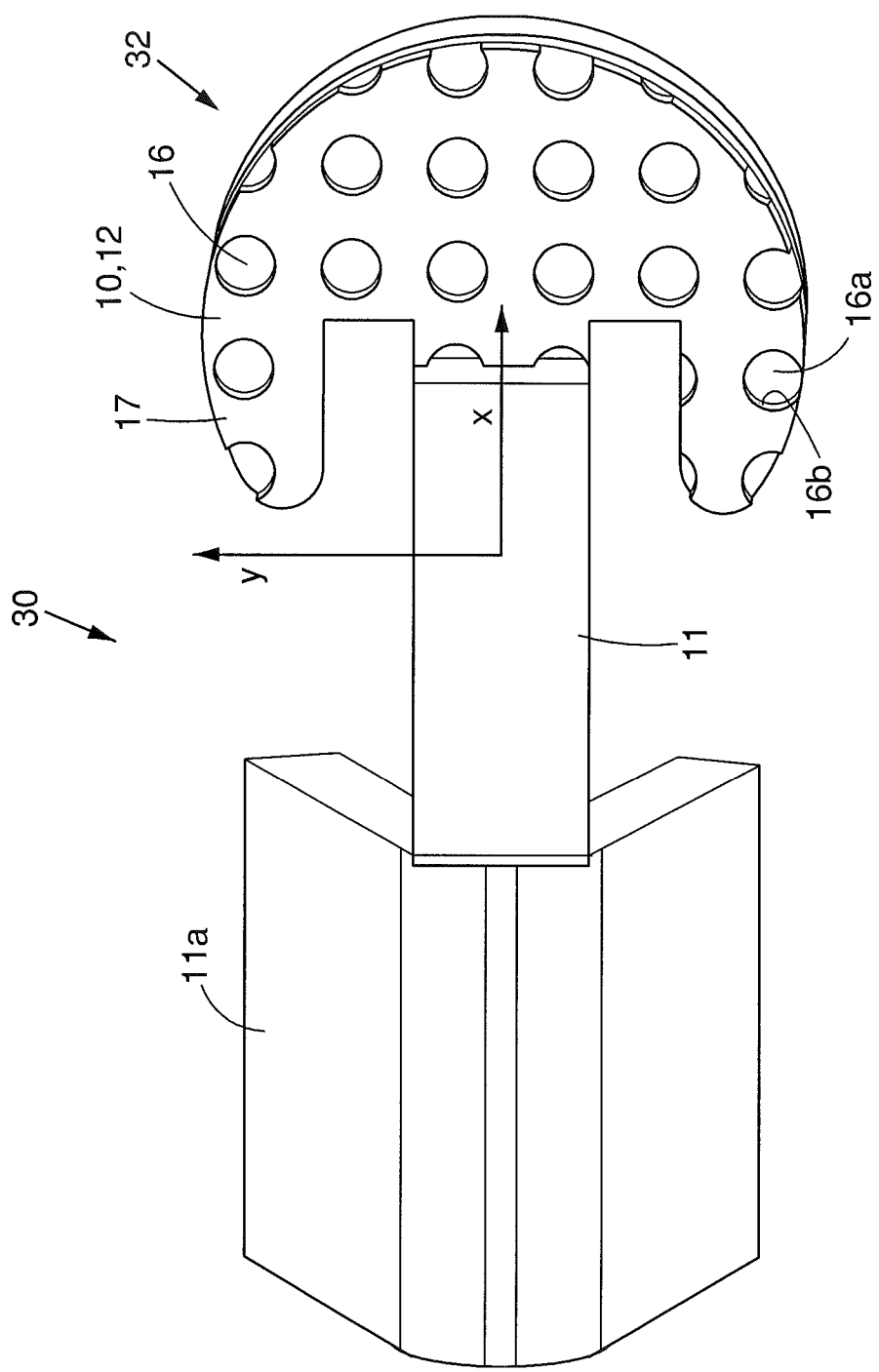
Figure 11:
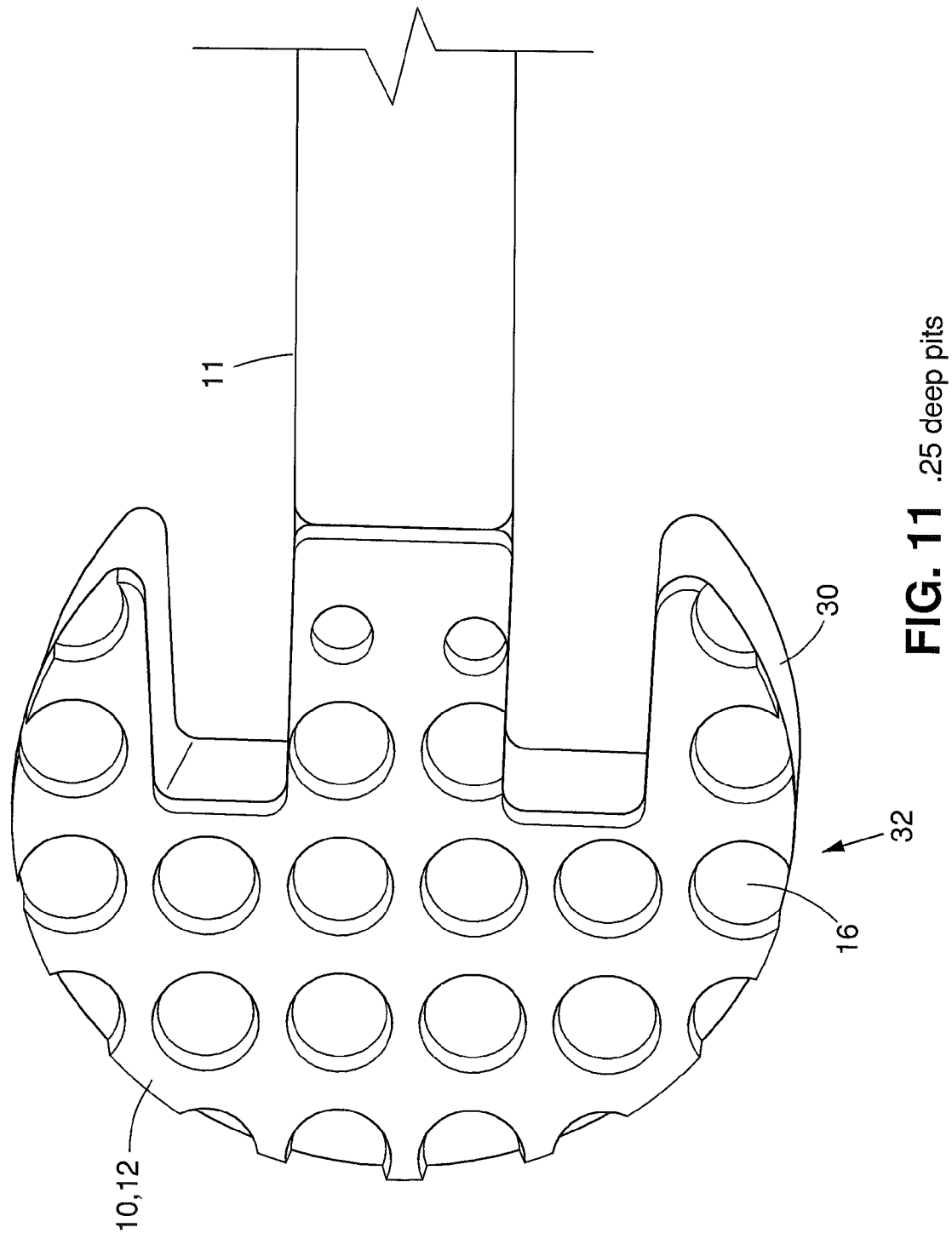
FIGS. 11-13 are drawings of the terminal pad of FIGS. 9A-10, having the flux wells or reservoirs (FIG. 11), having a layer of flux that has been subjected to being shipped 3 times (FIG. 12), and having the flux wiped off (FIG. 13).

Referring to FIGS. 4A-8, in one embodiment of the present invention, an electrical device, component or connector 20 can have about a ¾ partial circular shaped terminal pad 10 with a layer of solder 12 formed thereon, which can be generally flat or planar. The terminal pad 10 is connected to an arm 11 extending therefrom, which has a connector portion 11a (FIG. 10) for connecting to other devices, components or conductors, for example by engagement, soldering or crimping. The layer of solder 12 can have a series or pattern 15 of generally equally spaced apart protective or storage flux wells, reservoirs, pits or cavities 16 formed in the exterior or outer surface or face of the solder 12, such as by edm (electrical discharge machining). The flux wells 16 can be individual, can have a lateral width or diameter of about 0.05 mm (50 microns), and can be in a continuous pattern extending in the x and y directions with at least about 0.035 mm (35 microns) spacing in the x and y directions. An embodiment of an edm electrode for forming the flux wells 16 is shown in FIG. 8. As seen in FIG. 5, the pattern 15 of flux wells 16 does not have to be as precise as shown in the drawing of FIG. 4 and some flux wells 16 can overlap each other. The depth of the wells 16, or distance extending into the layer of solder 12 can be about 25%-50% of the width or diameter for example, about 0.023 mm (23 microns) deep. The flat lateral surface area of the layer of solder 12 of the terminal pad 10 prior to forming flux wells 16 shown in the drawing of FIG. 4A can be 16.25 mm², and the surface area including the flux wells 16 shown in FIG. 4B can be 20.25 mm². The addition of the flux wells 16 in the layer of solder 12 of the electrical component 20 can increase the surface area of the layer of solder 12 about 24.6% in comparison to just the flat lateral surface area. The flux wells 16 can have end walls 16a and side walls 16b, to which the flux 14 can adhere to or cover.

Referring to FIG. 6, a layer of flux 14 can be preapplied to the layer of solder 12. The flux 14 can be a type that dries and/or hardens, such as an activated rosin based flux for example, Kester 1544 and AIM RA301. In some embodiments, flux 14 can be Xersin 514. The flux 14 can cover the flat face or outer surfaces of the solder 12 and can also fill the flux wells 16. When a quantity of presoldered, prefluxed electrical components 20 are shipped, the vibration and agitation of the electrical components 20 during shipping and/or handling can cause adjacent electrical components 20 resting or contacting against each other to rub, wear, scrape, chip, crumble and/or flake the flux 14 off of the flat surfaces of the solder 12. However, the flux wells 16 can provide a protective reservoir within the solder 12 for protectively storing and retaining the flux 14, so that if a large quantity of flux 14 is scraped or flaked off the flat surfaces of the solder 12, the flux wells 16 can still protectively retain sufficient flux 14 for effectively soldering the terminal pad 20 to a surface. The size of the individual flux wells 16 can be large enough and the spacing or density adequate to store sufficient flux 14, and also provide protection against adjacent electrical components 20 contacting and removing flux 14. The surfaces of the solder 12 adjacent to or surrounding the flux wells 16 can provide raised or outwardly extending or facing protective ridges, bumps, projections, surfaces or structures 17 (FIG. 4C) for protecting the flux 14 within the flux wells 16. The ridges 17 can be connected or interconnected together. FIG. 7 shows that with the flux 14 wiped off the flat surfaces of the solder 12, that sufficient flux 14 can be retained within the wells 16. Heat introduced during soldering can vaporize the flux 14 within the wells 16. In some embodiments the heat introduced can be about 500° F.

Figure 12:
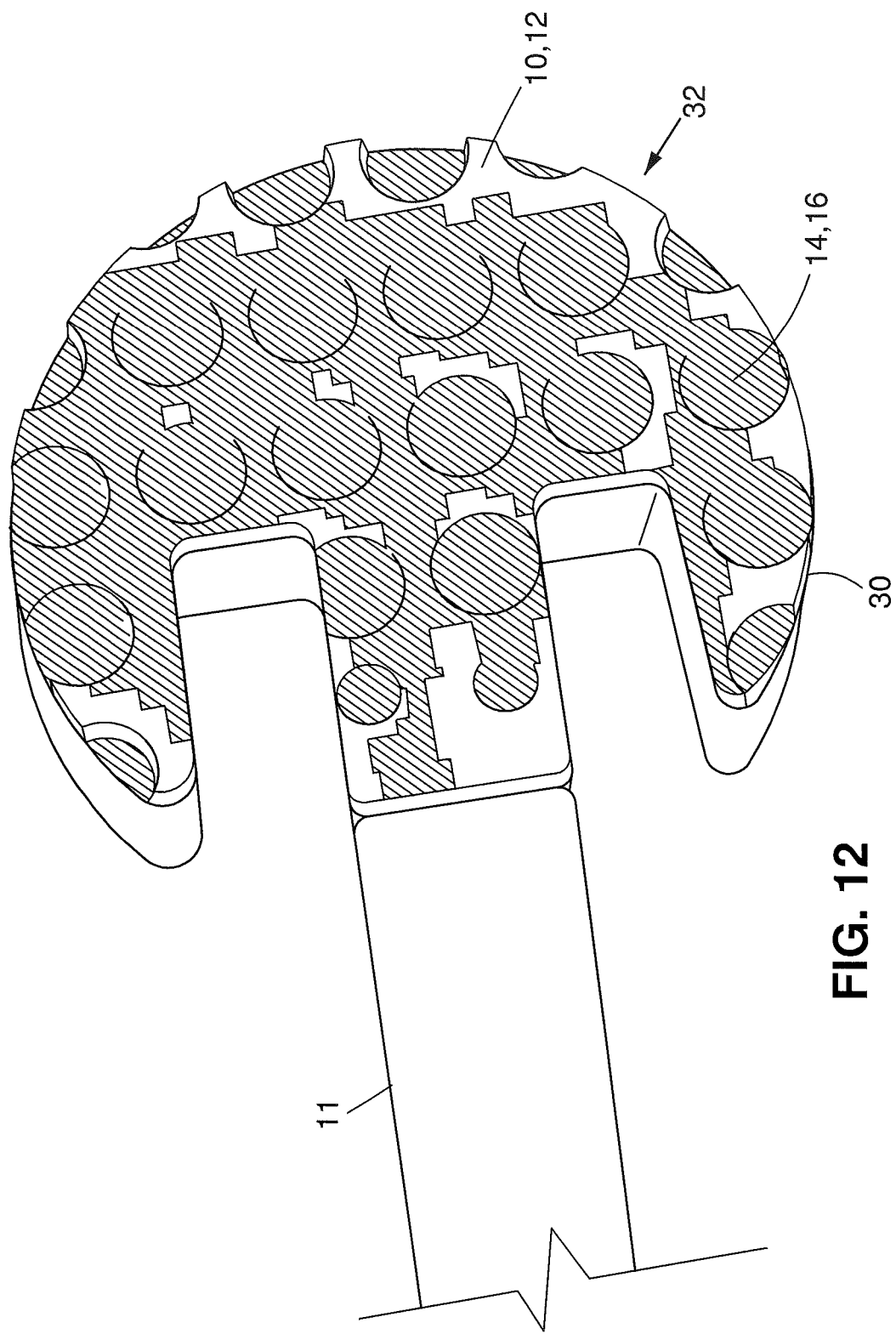
Figure 13:
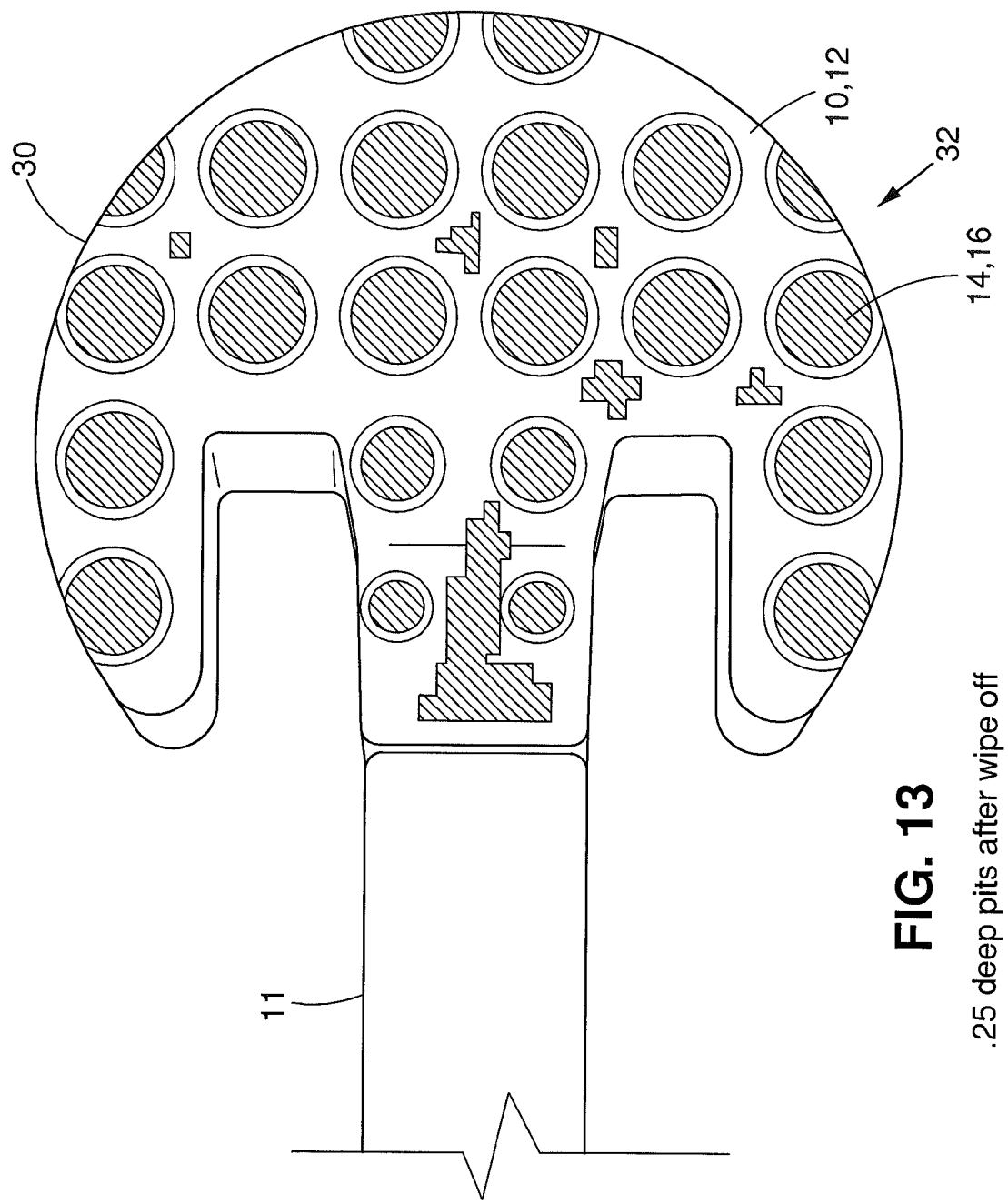

Electrical component 30, depicted in FIGS. 9A-13, is another embodiment having a terminal pad 10 with a layer of solder 12 in which the protective wells, reservoirs, pits or cavities 16 are larger than in FIGS. 4A-7 and can store more flux 14 in each well 16. The terminal pad 10 can be the same shape and size as in FIGS. 4A-7. The flux wells 16 can be individual, can have a lateral width or diameter of about 0.51 mm (510 microns), and can be in a continuous series or pattern 32 extending in the x and y directions with about 0.89 mm (890 microns) spacing in the x and y directions, which can be center to center. The depth of the flux wells 16 or distance extending into solder layer 12, can be about 0.25 mm (250 microns). Since each individual flux well 16 holds more flux 14 than in FIGS. 4A-7, the spacing can be larger. The flux 14 can cover or adhere to the end walls 16a and side walls 16b of the flux wells 16. The flux wells 16 can be formed in the outer or exterior surface or face of the layer of solder 12 by suitable methods including edm processes, rolling, molding or stamping. As can be seen in FIGS. 12 and 13, large quantities of flux 14 can be protectively stored and retained within the flux wells 16 despite rubbing, wearing, scraping, chipping, crumbling or flaking during shipping and/or handling, or if wiped off the flat surface, can still provide enough flux 14 to provide a viable or sufficient soldered joint. The larger and deeper flux wells 16 of electrical component 30 can in some cases better protect and hold flux 14 than smaller or shallower wells 16 in electrical component 20. The surfaces of the solder 12 adjacent to or surrounding the flux wells 16 can provide raised or outwardly extending protective ridges, bumps, projections, surfaces or structures 17 for protecting the flux 14 within the flux wells 16. The ridges 17 can be connected or interconnected together and can have a generally flat outer or exterior surface or face. Chipping and scraping over wells 16 that are shallow can in some instances more easily remove flux 14 from the wells 16, than from a deeper well 16.

The layer of solder 12 in some embodiments can be a nonlead or lead free solder composition. In one embodiment, the lead free solder composition can be about 65% indium, 30% tin, 4.5% silver and 0.5% copper, by weight. In other embodiments, other suitable lead free compositions can be used for the layer of solder 12 for example, about 66%-90% indium, 4%-25% tin, 0.5%-9% silver, 0.1%-8% antimony, 0.03%-4% copper, 0.03%-4% nickel, and 0.2%-6% zinc, by weight, and can further include in some embodiments, about 0.01%-0.3% germanium. An example of such a solder composition is about 75% indium, 15% tin, 6% silver, 1% antimony, 1% copper, 1% nickel, and 1% zinc. Typically, the flux 14 used for nonlead solder compositions is brittle, and easily rubs, wears, flakes, cracks, crumbles or chips off the layer of solder 12. In other embodiments, the layer of solder 12 can be a leaded solder composition. In one embodiment, the leaded solder composition can be about 25% tin, 62% lead, 10% bismuth and 3% silver, by weight. In other embodiments, other suitable leaded compositions can be used for the layer of solder 12. Some types of flux 14 used with leaded solder compositions can be brittle similar to the flux 14 for nonlead solder compositions, while other types of flux 14 used with leaded compositions can be more resistant to wear, chipping and flaking.

Figure 14:
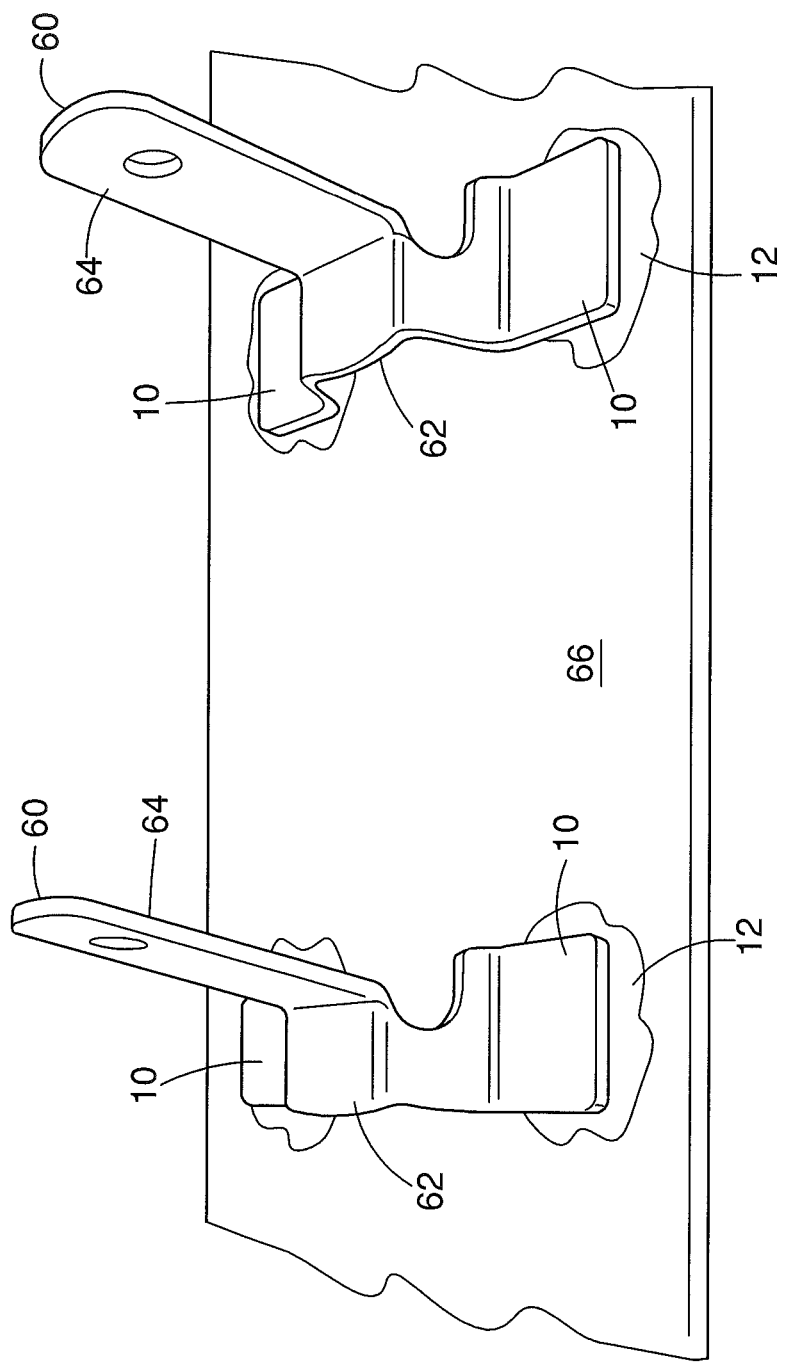
FIG. 14 is a perspective view of a series of example electrical components soldered to a surface or substrate for conducting pull tests.

Referring to FIG. 14, another embodiment of electrical components, such as example electrical devices, components or connectors 60, are shown soldered to a substrate or surface 66 which can be glass with a metalized soldering contact or terminal pad surface, such as automotive glass. The electrical components 60 can have two spaced apart generally rectangular terminal pads 10 which are connected together by a raised bridge portion 62. Each terminal pad 10 can have dimensions of about 4×7 mm, or about 28 mm² in area, with two terminal pads 10 collectively having about 56 mm² area. A connector portion such as a blade connector 64 can extend from the bridge portion 62 for mating with a desired element, such as a mating female flat socket, which can be at the end of or extend from a conductor or a device.

Figure 15:
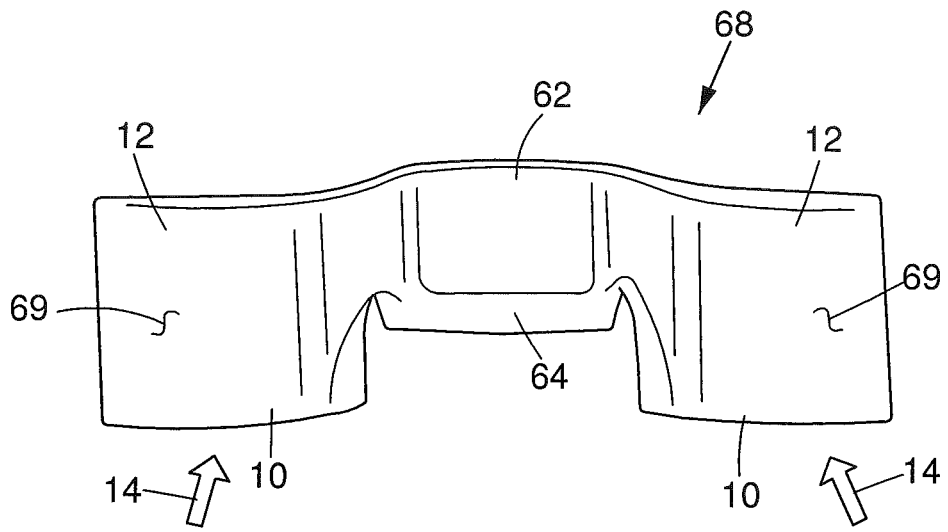
FIG. 15 is a bottom view of a prior art base control sample electrical component having terminal pads coated with solder without flux wells.

Referring to FIGS. 15-18, four different versions, types or embodiments of electrical component 60 were prepared, soldered to a substrate 66, and destructive pull tested to determine the pull force required to pull the electrical components 60 free from the substrate 66. Referring to FIG. 15, electrical component or connector 68 is a noninventive base control sample or prior art embodiment of an electrical component 60 to provide baseline or control sample test results for comparing with embodiments of the present invention shown in FIGS. 16-18. The two terminal pads 10 of electrical component 68 have a prior art conventional or standard layer of solder 12 on the bottom surfaces and do not have flux wells 16. The process that applied the layer of solder 12 to the terminal pads 10 of the electrical component 68 inherently provided a surface finish 69 on the exterior surface of the solder 12 which can have a surface roughness of about 5 microns (0.005 mm), or have surface pits about 5 microns deep. The layer of flux 14 was then applied over the exterior surface of the layer of solder 12. The 5 micron deep pits are too small to be considered flux wells 16 in the present invention.

Figure 16:
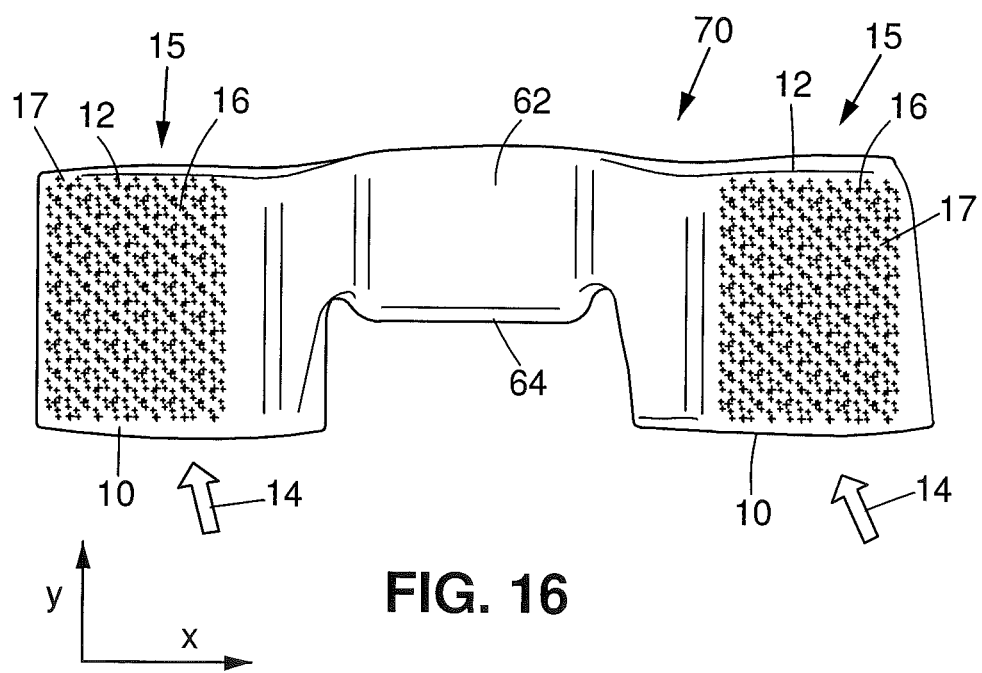
FIG. 16 is a bottom view of an embodiment of an electrical component in the present invention having a pattern of flux wells that are 23 microns deep.

Referring to FIG. 16, electrical device, component or connector 70 is an embodiment of component 60 in the present invention. The two terminal pads 10 of electrical component 70 have a layer of solder 12 formed on the bottom surfaces. The layer of solder 12 on the terminal pads 10 has a continuous series or pattern 15 of generally equally sized and spaced apart protective or storage flux wells, reservoirs, pits or cavities 16 formed or extending in the outer exterior surface, such as by edm, similar to electrical component 20, which are about 0.023 mm (23 microns) deep. The flux wells 16 can be individual, can have a diameter of about 0.05 mm (50 microns) and can be spaced apart at least about 0.035 mm (35 microns) in the x and y directions, which in some situations or portions can be center to center. Some wells 16 can overlap each other. The layer of flux 14 was then applied over the layer of solder 12, covering the exterior surface of the solder 12 and filling the flux wells 16. The depth of the flux wells 16, and the protective adjacent or surrounding ridges 17 that extend adjacent to, around or surround the flux wells 16, can provide protection against wear for the flux 14 contained within the flux wells 16.

Figure 17A:
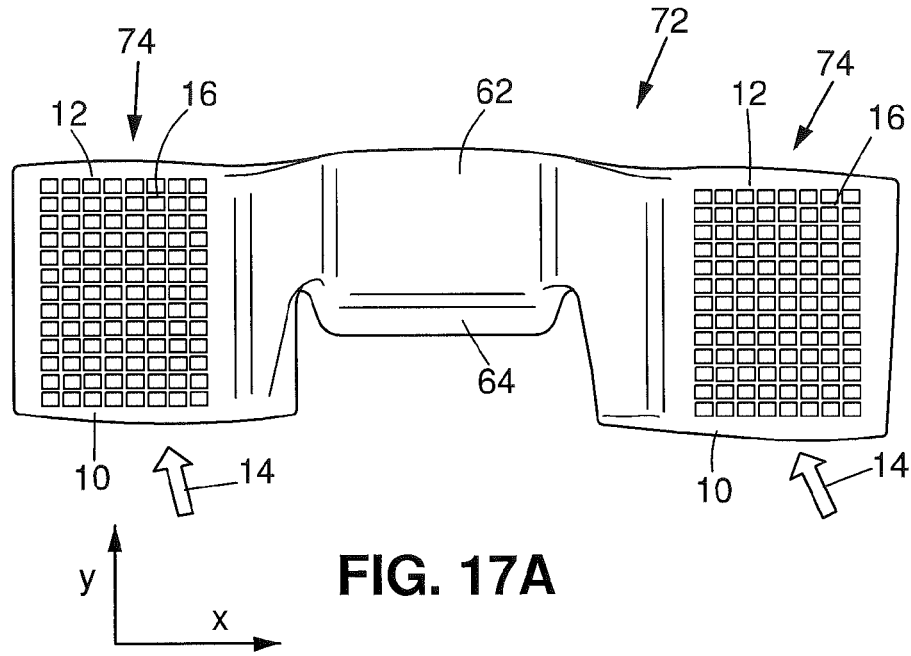
FIG. 17A is a bottom view of an embodiment of an electrical component in the present invention having a pattern of flux wells that are 150 microns deep.
Figure 17B:
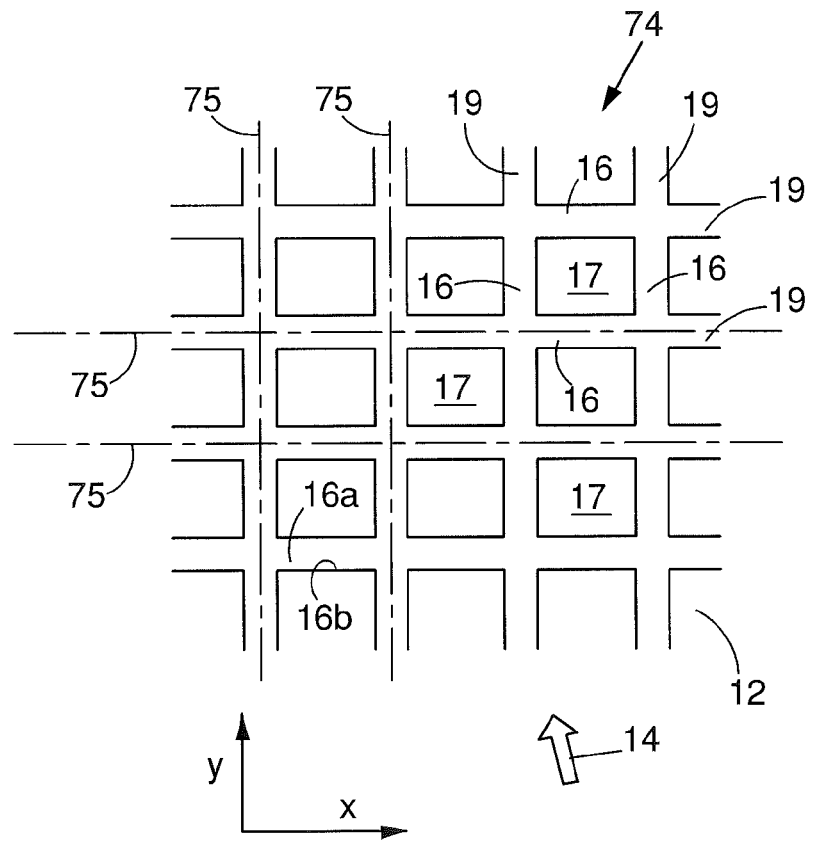
FIG. 17B is an enlarged view of the pattern of flux wells in FIG. 17A.

Referring to FIG. 17A, electrical device, component or connector 72 is another embodiment of component 60 in the present invention. The two terminal pads 10 of electrical component 72 have a layer of solder 12 formed on the bottom surfaces. The layer of solder 12 on the terminal pads 10 has a continuous series, pattern or grid 74 of criss crossing elongate grooves, trenches or reservoirs 19 in x and y directions at right angles along longitudinal axes 75, forming interconnected generally equally sized and spaced apart protective or storage flux wells, reservoirs, pits or cavities 16 formed or extending in the exterior surface (FIG. 17B).

The flux wells 16 can surround adjacent individual spaced apart raised or outwardly extending protective ridges, bumps, projections, surfaces or structures 17 which protect the flux 14 contained within the flux wells 16 from wear. For example, four flux wells 16 can surround a generally square protective ridge 17 on four sides, in repeating fashion, extending in the x and y directions. Each protective ridge 17 can be separated from neighboring protective ridges 17 by a flux well 16. The grooves 19 forming the flux wells 16 longitudinally connect ends of the flux wells 16 to each other along the x and y directions, and the protective ridges 17 separate the lateral sides of the flux wells 16 from each other in the x and y directions. In one embodiment, the flux wells 16 can be about 0.15 mm (150 microns) wide or in the lateral direction, and can be laterally separated by square ridges 17 about 0.25 mm (250 microns) from each other in the x and y directions. Since the flux wells 16 longitudinally extend in a connected manner, the length of each flux well 16 extending along a side of a ridge 17 can be considered to be either 0.25 mm (250 microns) long or 0.55 mm (550 microns) long in the longitudinal direction, depending upon if the length of the flux well 16 is measured to be equal only to the length of the side of a square ridge 17, or to also include the width of the two crossing flux wells 16. The depth of the grooves 19 and the flux wells 16 extending into the layer of solder 12 can be about 0.15 mm (150 microns) deep. The longitudinal axes 75 of the grooves 19 and flux wells 16 can be parallel and laterally spaced apart from each other about 0.4 mm (400 microns) centerline to centerline. The layer of flux 14 was then applied over the exterior surface of the layer of solder 12 and filling the flux wells 16. The flux 14 can cover or adhere to the end walls 16a and side walls 16b of the flux wells 16. The depth of the flux wells 16 and the protective ridges 17 adjacent to and surrounded by the flux wells 16 can provide protection against wear for the flux 14 contained within the flux wells 16. Although the protective ridges 17 are surrounded by flux wells 16, rather than surrounding the flux wells 16 with the protective ridges 17, the depth of the flux wells 16 and the consistent spacing of the protective ridges 17 in the x and y directions generally along a flat plane in a lateral manner across the solder 12, are able to provide sufficient protection against wear of the flux 14, such as by rubbing, chipping, flaking and crumbling.

Figure 18:
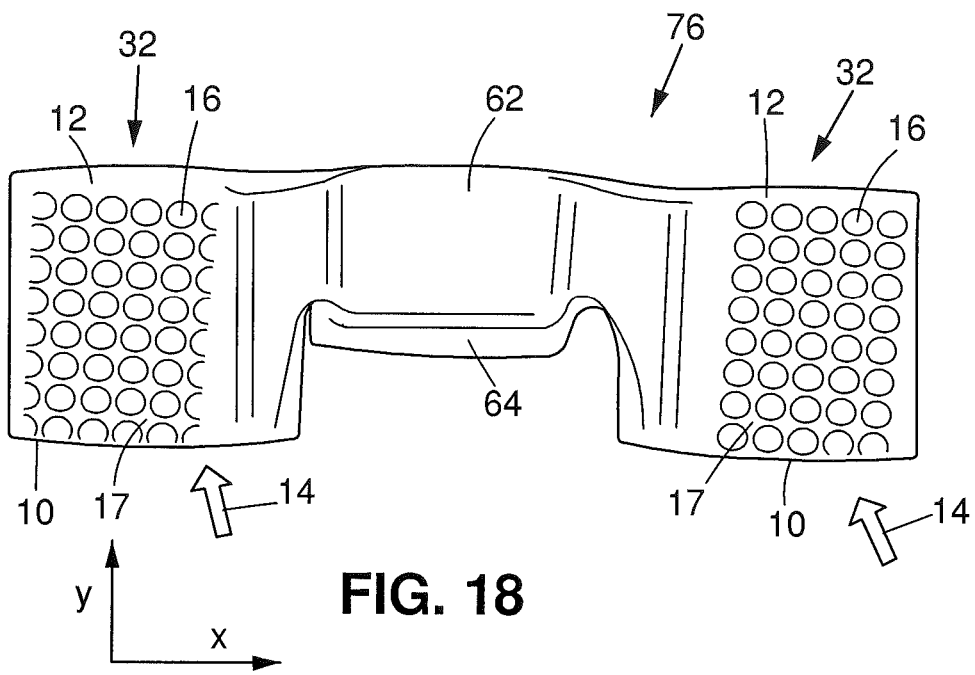
FIG. 18 is a bottom view of an embodiment of an electrical component in the present invention having a pattern of flux wells that are 250 microns deep.

Referring to FIG. 18, electrical device, component or connector 76 is another embodiment of component 60 in the present invention. The two terminal pads 10 of electrical component 76 have a layer of solder 12 formed on the bottom surfaces. The layer of solder 12 on the terminal pads 10 has a continuous series or pattern 32 of generally equally sized and spaced apart protective or storage flux wells, reservoirs, pits or cavities 16 formed or extending therein similar to electrical component 30, which can be individual, can be about 0.51 mm (510 microns) in lateral width or diameter and about 0.25 mm (250 microns) deep. The flux wells 16 can be in a continuous series or pattern extending in the x and y directions with about 0.89 mm (890 microns) spacing, which can be center to center. The layer of flux 14 was then applied over the exterior surface of the layer of solder 12 and filling the flux wells 16. The depth of the flux wells 16 and the protective ridges 17 surrounding the flux wells 16 can provide protection for the flux 14 contained within the flux wells 16. The ridges 17 can be in the form of a series or pattern of interconnected generally circular rings, walls or ridges 17, with each circular ridge 17 being raised or outwardly extending and surrounding a flux well 16. The flux wells 16 and the circular ridges 17 can be generally aligned along a planar or flat surface of the solder 12 laterally along x and y directions or axes. The ridges 17 can be formed by flat exterior surfaces of the layer of solder 12 and can have a generally flat outer face. As seen in FIG. 18, in some embodiments, the circular ridges 17 surrounding each flux well 16 can be an annular ring with a narrow width, such that a majority of the lateral surface area of the solder 12 facing outwardly is within a flux well 16, and a majority of the flux 14 is protected from wear. The width or thickness of the wall of the circular ridges 17 can be about ¼ the width or diameter of the flux wells 16, for example in some embodiments, about 0.12 mm (120 microns). At least 60%, sometimes 70% or 75% of the surface of the layer of solder 12 on the terminal pads 10 of electrical component 76 can be within a flux well 16, thereby protecting a corresponding percentage of flux 14 from wear within the flux wells 16. The interconnected circular ridges 17 can provide a raised or outwardly extending protective lattice ridge structure for protecting the flux 14 within the flux wells 16 from chipping, flaking, rubbing, crumbling or wear from other connectors during shipping and/or handling.

Tests were conducted for the electrical components 68, 70, 72 and 76 of FIGS. 15-18, to compare destructive pull test results of soldered electrical components 70, 72 and 76 in the present invention (FIGS. 16-18) having flux wells 16 in the layer of solder 12, with a soldered noninventive baseline or control prior art electrical component 68 (FIG. 15) having a standard layer of solder 12. Tests were conducted for both lead free solder compositions and leaded solder compositions. The following electrical components were tested:

1. Prior art electrical component 68 shown in FIG. 15 having 5 micron pits that are not considered to be flux wells.
2. Electrical component 70 shown in FIG. 16 having 23 micron pits or flux wells.
3. Electrical component 72 shown in FIGS. 17A and 17B having 150 micron pits or flux wells.
4. Electrical component 76 shown in FIG. 18 having 250 micron pits or flux wells.

All the electrical components 68, 70, 72, and 76 have the same basic connector 60, but the layers of solder 12 have different configurations.

Test 1—Lead Free Solder 50 samples of each electrical component 68 (FIG. 15 prior art base control, 5 micron pits), electrical component 70 (FIG. 16, 23 micron pits), electrical component 72 (FIG. 17A, 150 micron pits) and electrical component 76 (FIG. 18, 250 micron pits) having a layer of a lead free solder 12 with a composition of about 65% indium, 30% tin, 4.5% silver and 0.5% copper, were sprayed with a flux 14 suitable for lead free solder compositions (standard AIM RA301 blue flux), under normal production processes and allowed to dry overnight. All samples were then packaged with no packing filler to allow for movement of parts within the package and shipped via United Parcel Service from one location in Rhode Island to another location within Rhode Island, to rub or wear off portions of flux 14 from the terminal pads 10 by the shipping and handling. Eight samples of each different type or embodiment of electrical component 68, 70, 72 and 76 were then soldered to test glass substrates 66. The prior art base control electrical components 68 (FIG. 15, 5 micron pits) were soldered by a standard Antaya Q-Box soldering device at 650 watt seconds. The electrical components 70 (FIG. 16, 23 micron pits), electrical components 72 (FIG. 17A, 150 micron pits) and electrical components 76 (FIG. 18, 250 micron pits) of the present invention were soldered at 600 watt seconds. The flux wells 16 in the solder 12 of the electrical components 70, 72 and 76 of the present invention provide a more uniform heat distribution across the layer of solder 12 and allows less input heat to be used for soldering than with layers of solder 12 that do not have flux wells 16 of the prior art base control electrical component 68, for comparable soldering characteristics. Using less input heat when soldering to a glass substrate 66 is desirable because it reduces the chance of damaging or cracking the glass, and also shortens soldering time. The eight samples of each different component 68, 70, 72 and 76 were then destructive pull tested to determine the force required to pull the soldered electrical components free from the substrate 66. The average pull force in pounds for the eight samples for each different type of electrical component having a layer of lead free solder 12, is provided below in Table 1.

TABLE 1

Pull Tests/Lead Free Solder

| Electrical Component | Average Pull Test for Eight Samples |
| --- | --- |
| FIG. 15 base control component 68, 5 micron pits | 135.8 lbs. |
| FIG. 16 component 70, 23 micron pits | 153.6 lbs. |
| FIG. 17A component 72, 150 micron pits | 158.6 lbs. |
| FIG. 18 component 76, 250 micron pits | 164.4 lbs. |

As can be seen in Table 1, the electrical components 70, 72 and 76 of FIGS. 16, 17A and 18 of the present invention, which have the flux wells 16, recorded considerably higher average pull test results than the base control prior art electrical component 68 of FIG. 15. The pull tests for the electrical component 70 of FIG. 16 (23 micron pits) averaged about 17 lbs. higher, the electrical component 72 of FIG. 17A (150 micron pits) averaged about 22.8 lbs. higher, and the electrical component 76 of FIG. 18 (250 micron pits) averaged about 28.6 lbs. higher. The flux wells 16 in the present invention are able to protect and retain more flux 14 on the surface of the solder 12 from wear during shipping and handling than the prior art base control electrical component 68 of FIG. 15 that does not have flux wells 16. The ability to increase the amount of flux 14 retained on the surface of the solder 12 after wear from shipping and handling with flux wells 16 in the present invention can increase the strength of the soldered joint to a substrate 66, which is evidenced by the increase in pull strength over the base control prior art component 68 (FIG. 15). Although the prior art base control component 68 of FIG. 15 has 5 micron pits, it is evident by the low pull test results, that the 5 micron pits are too small to function as, or to be considered flux wells 16 for protecting flux 14 from wearing off, in comparison with the tested embodiments of the present invention. Lower pull test results can correlate to more flux 14 wearing off, resulting in a weaker soldered joint. The increase in pull strength in the present invention between the electrical components 70, 72 and 76 of FIGS. 16, 17A and 18, with increase in the size of the flux wells 16, can be due to the fact that larger flux wells 16 (width and/or depth) can protect and retain a greater amount of flux 14 on the solder 12 from wear during shipping and handling than smaller flux wells.

Figure 19:
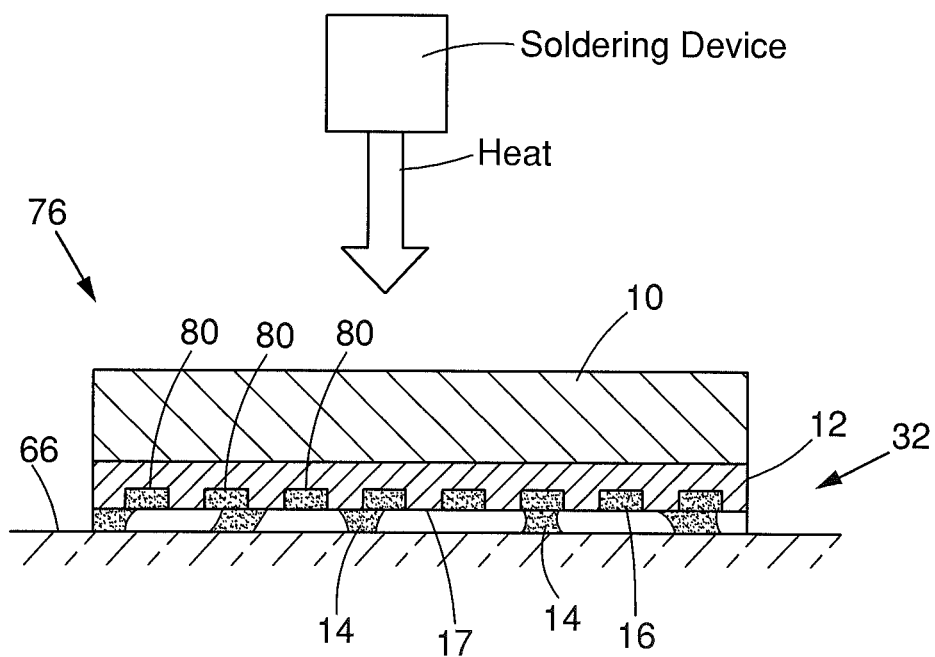
FIG. 19 is a side sectional view of the terminal pad of the electrical component of FIG. 18 on a surface or substrate for soldering.

FIG. 19 shows a terminal pad 10 of electrical component 76 on a substrate 66 for soldering with flux 14 retained in a pattern 32 of flux wells 16 that extend 250 microns deep in the solder 12, and some flux 14 still on the outer surface of the solder 12 after wear from shipping and handling. The thickness of the flux 14 on the bottom or outer face of ridges 17 are shown oversized for illustrative purposes, and can be thin so that the ridges 17 can generally contact or be close to contacting the substrate 66. The raised or outwardly extending ridges 17 surrounding the flux wells 16 raise or evenly separate or space portions 80 of solder 12 within flux wells 16 above or away from the substrate 66 evenly in the x and y directions and out of contact with the substrate 66. This takes the raised or spaced portions 80 of solder 12 out of heat sink contact with the substrate 66, allowing for more even heating and melting of the solder 12 when applying heat from the soldering device during soldering, and at a lower temperature or with less input heat for a shorter period of time. The raised portions 80 formed by the flux wells 16 also provide space for which the solder 12 and flux 14 to flow during soldering. This can also increase the pull test results for the electrical components that have the larger flux wells 16. The larger the flux wells 16, the further away portions 80 of solder 12 within the flux wells 16 can be spaced from the substrate 66 to be soldered to, and the more room that is available for solder 12 to move and flow. The flux wells 16 and the ridges 17 can also provide a more consistent heat distribution across the soldering surface by forming equally sized and spaced solder heat sink contact points onto the substrate 66 in x and y directions, and also provides equally sized and spaced heat flow paths.

Test 2—Leaded Solder 50 samples of each electrical component 68 (FIG. 15 prior art base control, 5 micron pits), electrical component 70 (FIG. 16, 23 micron pits), electrical component 72 (FIG. 17A, 150 micron pits) and electrical component 76 (FIG. 18, 250 micron pits) having a layer of leaded solder 12 with a composition of about 25% tin, 62% lead, 10% bismuth and 3% silver, were sprayed with a flux 14 suitable for leaded solder compositions (Xersin 514 red flux), under normal production processes and allowed to dry overnight. All samples were then packaged with no packing filler to allow for movement of parts within the package and shipped via United Parcel Service from one location in Rhode Island to another location within Rhode Island, to rub or wear off portions of flux 14 from the terminal pads 10 by wear against adjacent components, by the shipping and handling. Eight samples of each different type or embodiment of electrical component 68, 70, 72 and 76 were then soldered to test glass substrates 66 at 950 watt seconds using a standard Antaya Q-Box soldering device. The eight samples of each different component 68, 70, 72 and 76 were then destructive pull tested to determine the force required to pull the soldered electrical components free from the substrate 66. The average pull force in pounds for the eight samples for each different type of electrical component having a layer of leaded solder is provided below in Table 2.

TABLE 2

Pull Tests/Leaded Solder

| Electrical Component | Average Pull Test for Eight Samples |
| --- | --- |
| FIG. 15 base control component 68, 5 micron pits | 185.8 lbs. |
| FIG. 16 component 70, 23 micron pits | 167.8 lbs. |
| FIG. 17A component 72, 150 micron pits | 152.1 lbs. |
| FIG. 18 component 76, 250 micron pits | 169.9 lbs. |

The flux 14 used with leaded solder 12 is often not as prone to chipping and flaking, rubbing and wearing as flux 14 used with lead free solder. As a result, with leaded solder, the prior art base control component 68 of FIG. 15 shipped within Rhode Island does not have a lower pull test than the components 70, 72 and 76 of FIGS. 16, 17A and 18 that have the flux wells 16 in the present invention. Although the components 70, 72 and 76 of FIGS. 16, 17A and 18 in the present invention had lower pull test results than the prior art base control component 68 of FIG. 15, the force numbers are still well above the minimum desired force threshold of 22.4 lbs. for soldering to a glass substrate 66. By comparing the results of Table 1 for lead free solder with the results of Table 2 for leaded solder, it can be seen that the pull test force results for the components 70, 72 and 76 of FIGS. 16, 17A and 18 with leaded solder 12 generally have a similar numerical force as the pull test force results for the components 70, 72 and 76 of FIGS. 16, 17A and 18 with lead free solder 12. As a result, the use of the flux wells 16 in the present invention can provide generally numerically or statistically consistent and similar pull test force results that exceed the desired minimum requirement, for both leaded and lead free solder compositions, so that the same configuration of components 70, 72 and 76 of FIGS. 16, 17A and 18 and flux wells 16 can be used for both leaded and lead free solder 12. This can make manufacturing process changes between leaded and lead free solder components quick and easy by merely changing the type of solder and flux used in the manufacturing machinery. Although there might not have been a pull test performance advantage in having flux wells 16 in a layer of leaded solder 12, for short shipping distances, an advantage is that the manufacturing processing equipment does not have to be changed when changing over from electrical components having lead free solder 12 to electrical components having leaded solder 12. Although the tested flux wells 16 for short shipping distances did not provide increased performance for leaded solder 12, the ability of the same manufacturing equipment and electrical component design to protect and retain a sufficient amount of more brittle flux 14 on lead free solder 12 to provide a consistent stronger soldered joint is advantageous. However, it is expected that for longer shipping distances, for example cross country or overseas, that much more flux 14 would wear off the layer of leaded solder 12 on the prior art base control component 68 of FIG. 15, and that the test results might more closely resemble the test results for lead free solder. Consequently, for short shipping distances, the flux wells 16 provide immediate increased solder joint performance for prefluxed lead free solder 12, and for long distance shipping, should provide increased solder joint performance for prefluxed leaded solder 12 in addition to the prefluxed lead free solder 12.

Figure 20:
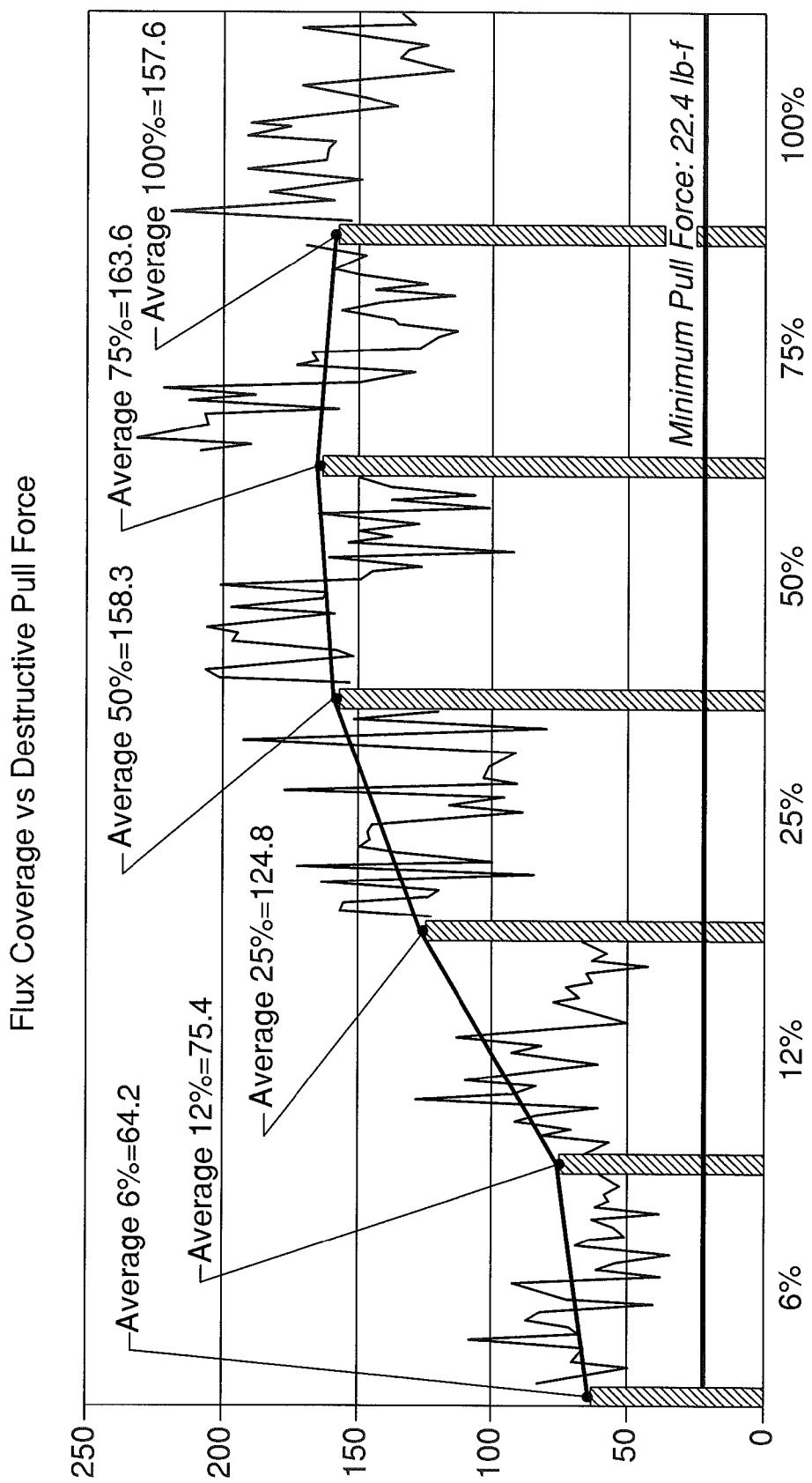
FIG. 20 is a graph depicting test results for percentage of flux coverage on the solder of electrical components versus destructive pull force.

Referring to FIG. 20, sample electrical components 60 were soldered to a substrate 66 with varying flux 14 coverage percentages on the layer of solder 12 that is on terminal pads 10, and destructive pull tested, to determine the desired amount of flux retention coverage that the flux wells 16 should retain. The curve of the graph shows a generally flat pull force line between 50% and 100% flux coverage, so that that statistically, flux coverage between 50% and 100% provides about the same pull test results (between about 157 and 163 lb. average). The curve of the graph rises more rapidly upwardly from 25% flux coverage to 50% flux coverage. As can be seen by comparing the pull test force results of Tables 1 and 2, with the pull test force results provided in the graph of FIG. 20, the pull test force numbers for the present invention components 70, 72 and 76 having the flux wells 16 with both lead free and leaded solder compositions are generally statistically comparable to the pull test figures for at least about 50% flux coverage or higher (the 50% to 100% range). It appears that based on the test results, the flux wells 16 in the present invention are able to provide protection for flux 14 on the solder 12 of terminal pads 10 of electrical components 70, 72 and 76 from wear during shipping and handling to preserve on average, generally, statistically or approximately, at least about 50% or higher coverage of flux 14 on the solder 12.

Referring to Table 1, the average pull test results for the base control prior art electrical component 68 of FIG. 15 with lead free solder 12 and corresponding flux 14, was 135.8 lbs. Referring to the graph of FIG. 20, this would correlate to much less than 50% flux coverage, somewhere around 35% flux coverage. This means a high percentage of flux 14 was worn off (about 65%) merely by shipping within the state of Rhode Island. As can be seen, the 5 micron pits in the layer of solder 12 of the prior art base control component 68 do not provide protection for flux 14, and therefore do not function as and cannot be considered flux wells. Shipment of the base control prior art electrical component 68 across the country or overseas would likely provide a bigger difference between the pull test results between the base control prior art electrical component 68 and the electrical components 70, 72 and 76 in the present invention for lead free solder 12 and corresponding flux 14.

Referring to Table 2, the average pull test results for the base control prior art electrical component 68 of FIG. 15 with the leaded solder 12 and corresponding flux, was 185.8 lbs. Referring to the graph of FIG. 20, this would suggest that a sufficient amount of flux 14 can be retained on the surface of the solder 12, above 50%, for leaded solder 12 compositions and corresponding flux 14, for prior art base control electrical components 68 without flux wells 16, for a short shipment distance within Rhode Island. As previously mentioned, shipment of electrical components having leaded solder 12 cross country or overseas would be expected to likely cause a lot more wear of flux 14, and provide test results close to the results for lead free solder 12.

Even if the flux wells 16 do not provide an increase in pull force performance with leaded solder, such as for short shipping distances, with industry using both lead free and leaded solder compositions, the electrical components 70, 72 and 76 having flux wells 16 in the present invention can provide generally, statistically at least about 50% flux 14 coverage after wear from shipping and/or handling for both lead free and leaded solder 12 compositions and corresponding fluxes 14. It can be seen that the flux wells 16 tested having widths or diameters ranging from about 0.05 mm (50 microns) to 0.51 mm (510) microns, depths ranging from about 0.023 mm (23 microns) to 0.25 mm (250 microns), and spacing ranging from about 0.035 mm (35 microns) to 0.89 mm (890 microns), provided sufficient flux 14 protection and retention from wear during shipping and handling for obtaining consistent acceptable soldered joints.

FIGS. 21A-21D depict an embodiment of an electrical component 40, which can be a solder clad strip or buss bar assembly. The buss bar assembly can have an elongate soldering surface or terminal pad 10, with an elongate generally rectangular or ribbon shaped layer of solder 12. An elongate linear knurled pattern 18 can be formed in the layer of solder 12 with a knurling wheel to form linear or elongate flux reservoirs, canals or trenches 18a which can protectively store and retain flux 14 in spaced apart parallel linear or elongate lines. The flux trenches 18a can consist of a continuous series of generally equally spaced apart elongate parallel indentations within the solder 12, which can be linear as shown, and also perpendicular to the longitudinal direction of the terminal pad 10, and solder 12. The flux trenches 18a can be spaced apart, by about 1/16 inch (1.6 mm), can be about 0.1-0.36 mm wide and about 0.01 mm deep. In some embodiments, the width of the flux reservoirs 18a can be angled.

FIGS. 22A-22D depict an embodiment of an electrical component 50, which can be a solder clad strip with a crimped blade. The electrical component 50 can have an elongate soldering surface or terminal pad 10 with an elongate generally rectangular or ribbon shaped layer of solder 12. An elongate linear knurled pattern 19 can be formed in the layer of solder 12 with a knurling wheel, and differs from knurled pattern 18 in that it includes linear or elongate flux reservoirs, canals or trenches 19a and 19b for protecting, storing and retaining flux 14. The flux trenches 19a and 19b can each consist of a continuous series of generally equally spaced apart elongate parallel indentations, which can be linear, at an angle relative to the longitudinal direction of the terminal pad 10, and crossing each other as shown, to form a diamond shaped knurled pattern. The trenches 19a and 19b can have the same or similar spacing, width and depth as trenches 18a, and can be connected or interconnected with each other. The trenches 19a and 19b can have double the flux capacity of trenches 18a.

The knurled patterns 18 and 19 of electrical components 40 and 50 do provide some flux protection and better soldered joints than if the knurled patterns 18 and 19 were omitted. It has been determined that the flux wells 16 of electrical connectors 20, 30, 70, 72 and 76, provide further improved performance in obtaining a suitable soldered joint than provided by the knurled canal or trench patterns 18 and 19 of electrical components 40 and 50. The deeper and closer x-y spacing of the flux wells 16 in connectors 20, 30, 70, 72 and 76 can provide better consistent spaced apart x-y flux retention from wear and distribution flux or solder flow, as well as provide consistent x-y spaced apart small intermittent equal sized locations of raised or outwardly extending solder portions or ridges 17 that touch the surface or substrate 66, to be soldered in heat sink contact.

While this invention has been particularly shown and described with references to example embodiments thereof, it will be understood by those skilled in the art that various changes in form and details may be made therein without departing from the scope of the invention encompassed by the appended claims.

For example, although some dimensions and shapes have been described, these can vary depending upon the situation at hand. The flux wells 16 are often but do not have to be round, and can include noncircular curves or can be polygonal, or can have linear line portions connected together. The flux reservoirs or trenches 18a, 19a and 19b do not have to be linear, but can have angles and/or curves. Although particular dimensions have been described, it is understood that dimensions can vary depending on the situation at hand. In addition, although certain terms of orientation have been used, this is not meant to limit orientation of features or components in the present invention. Furthermore, various features for the present invention can be combined together or omitted. It is also understood that electrical devices, components or connectors in the present invention can have different configurations than the examples shown and described.

What is claimed is:
1. An electrical component comprising:
a terminal pad having a terminal pad surface;

a layer of lead free solder consisting of 66% to 90% indium, 4% to 25% tin, 0.5% to 9% silver, 0.1% to 8% antimony, 0.03% to 4% copper, 0.03% to 4% nickel, and 0.2% to 6% zinc by weight on the terminal pad surface, the layer of solder having a solder surface opposite the terminal pad surface with flux wells formed in the solder surface configured to protectively store and retain flux therein, the flux wells having a lateral dimension of at least 0.05 mm and a depth of at least 0.023 mm; and a layer of flux on at least a portion of the solder surface and filling at least a portion of the flux reservoirs.

2. The electrical component of claim 1, wherein the flux wells are in a generally even lateral spaced apart distribution in x and y directions across the solder layer.

3. The electrical component of claim 1, wherein the flux wells are interconnected and formed by a grid of criss-crossing grooves in x and y directions about 0.15 mm wide, about 0.15 mm deep, and separated from each other by about 0.25 mm.

4. The electrical component of claim 1 further comprising a connector portion extending from the terminal pad for connection to a desired element.

5. The electrical component of claim 1, wherein the flux is a type suitable for lead free solder compositions.

6. A method of protecting flux on a presoldered prefluxed electrical component comprising the steps of:

providing the electrical component with a terminal pad having a terminal pad surface;

providing a layer of lead free solder consisting of 66% to 90% indium, 4% to 25% tin, 0.5% to 9% silver, 0.1% to 8% antimony, 0.03% to 4% copper, 0.03% to 4% nickel, and 0.2% to 6% zinc by weight, the layer of solder having a solder surface opposite the terminal pad surface that includes a series of generally equally spaced apart flux wells formed in the solder surface which protectively store and retain flux therein from wear during shipping and/or handling, the flux wells having a lateral dimension of at least 0.05 mm and a depth of at least 0.023 mm that is deep enough for retaining a quantity of flux therein when flux on the surface of the layer of solder wears off during shipping and/or handling; and providing a layer of flux on the solder surface, at least portions of the flux filling the flux wells.

7. The method of claim 6, wherein the flux wells are in a generally even lateral spaced apart distribution in x and y directions across the solder surface.

8. The method of claim 6, further comprising the step of providing the electrical component with a connector portion extending from the terminal pad for connecting to a desired element.

9. The method of claim 6, wherein the flux is a type of suitable for lead free solder compositions.

10. A method of protecting flux on a presoldered prefluxed electrical component comprising the steps of:

providing the electrical component with a terminal pad having a terminal pad surface;

providing a layer of lead free solder consisting of 66% to 90% indium, 4% to 25% tin, 0.5% to 9% silver, 0.1% to 8% antimony, 0.03% to 4% copper, 0.03% to 4% nickel, and 0.2% to 6% zinc by weight, the layer of solder having a solder surface opposite the terminal pad surface with a pattern of generally equally spaced apart flux reservoirs formed in the surface of the solder which protectively store and retain flux therein from wear during shipping; and providing a layer of flux on the solder surface, at least portions of the flux filling the flux reservoirs.

11. The electrical component of claim 2, wherein the flux wells have a diameter of at least 0.05 mm, a depth of at least 0.023 mm, and are in a continuous pattern with at least 0.035 mm spacing in x and y directions.

12. The electrical component of claim 2, wherein the flux wells have a diameter of about 0.051 mm, a depth of about 0.25 mm, and are in a continuous pattern with about 0.89 mm spacing in the x and y directions.

13. The method of claim 7, further comprising the step of providing the flux wells with a diameter of at least 0.05 mm, a depth of at least 0.023 mm, and a continuous pattern with at least 0.035 mm spacing in x and y directions.

14. The method of claim 7, further comprising the step of providing the flux wells with a diameter of about 0.51 mm, a depth of about 0.25 mm, and a continuous pattern with about 0.89 mm spacing in the x and y directions.

15. The method of claim 7, further comprising the step of providing interconnected flux wells formed by a grid of criss-crossing grooves in x and y directions about 0.15 mm wide, about 0.15 mm deep, and separated from each other by about 0.25 mm.

16. An electrical component, comprising:

a terminal pad having a terminal pad surface;

a layer of lead free solder consisting of 66% to 90% indium, 4% to 25% tin, 0.5% to 9% silver, 0.1% to 8% antimony, 0.03% to 4% copper, 0.03% to 4% nickel, 0.2% to 6% zinc by weight, and 0.01% to 0.3% germanium by weight on the terminal pad surface, the layer of solder having a solder surface opposite the terminal pad surface with a series of generally equally spaced apart flux wells formed in the solder surface configured to protectively store and retain flux therein, the flux wells having a lateral dimension of at least 0.05 mm and a depth of at least 0.023 mm; and a layer of flux on at least a portion of the solder surface and filling at least a portion of the flux reservoirs.

17. A method of protecting flux on a presoldered prefluxed electrical component, comprising the steps of:

providing the electrical component with a terminal pad having a terminal pad surface;

providing a layer of lead free solder consisting of 66% to 90% indium, 4% to 25% tin, 0.5% to 9% silver, 0.1% to 8% antimony, 0.03% to 4% copper, 0.03% to 4% nickel, 0.2% to 6% zinc by weight, and 0.01% to 0.3% germanium by weight, the layer of solder having a solder surface opposite the terminal pad surface that includes a series of generally equally spaced apart flux wells formed in the solder surface which protectively store and retain flux therein from wear during shipping and/or handling, the flux wells having a lateral dimension of at least 0.05 mm and a depth of at least 0.023 mm that is deep enough for retaining a quantity of flux therein when flux on the surface of the layer of solder wears off during shipping and/or handling; and providing a layer of flux on the solder surface, at least portions of the flux filling the flux wells.

18. A method of protecting flux on a presoldered prefluxed electrical component, comprising the steps of:

providing the electrical component with a terminal pad having a terminal pad surface;

providing a layer of lead free solder consisting of 66% to 90% indium, 4% to 25% tin, 0.5% to 9% silver, 0.1% to 8% antimony, 0.03% to 4% copper, 0.03% to 4% nickel, 0.2% to 6% zinc by weight, and 0.01% to 0.3% germanium by weight, the layer of solder having a solder surface opposite the terminal pad surface with a pattern of generally equally spaced apart flux reservoirs formed in the surface of the solder which protectively store and retain flux therein from wear during shipping; and providing a layer of flux on the solder surface, at least portions of the flux filling the flux reservoirs.

\* \* \* \* \*